US012489063B2

(12) United States Patent
Huang et al.

(10) Patent No.: US 12,489,063 B2
(45) Date of Patent: Dec. 2, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Lin-Yu Huang, Hsinchu (TW); Chun-Hung Liao, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 723 days.

(21) Appl. No.: 17/864,305

(22) Filed: Jul. 13, 2022

(65) Prior Publication Data

US 2024/0021535 A1 Jan. 18, 2024

(51) Int. Cl.
*H01L 23/544* (2006.01)
*H01L 21/768* (2006.01)
*H01L 23/522* (2006.01)
*H10D 30/43* (2025.01)
*H10D 30/67* (2025.01)

(52) U.S. Cl.
CPC ...... *H01L 23/544* (2013.01); *H01L 21/76819* (2013.01); *H01L 21/7684* (2013.01); *H01L 21/76877* (2013.01); *H01L 23/5226* (2013.01); *H01L 2223/54426* (2013.01); *H10D 30/43* (2025.01); *H10D 30/6735* (2025.01); *H10D 30/6757* (2025.01)

(58) Field of Classification Search
CPC ............ H01L 23/544; H01L 21/76895; H01L 21/76897; H10D 30/6757; H10D 30/014; H10D 30/797; H10D 62/121; H10D 64/017; H10D 64/256; H10D 62/364; H10D 62/822; H10D 62/824; H10D 62/151
See application file for complete search history.

(56) References Cited

U.S. PATENT DOCUMENTS 9,209,247 B2   12/2015   Colinge et al.
9,236,267 B2   1/2016   De et al.
(Continued)

*Primary Examiner* — Julia Slutsker
(74) *Attorney, Agent, or Firm* — JCIPRNET

(57) ABSTRACT

A semiconductor device includes a semiconductor substrate, at least two source/drain features, at least two source/drain features, one or more channel layers, a gate structure, a first conductive feature, a second conductive feature, and an alignment mark. The semiconductor substrate has a first region and a second region next to the first region. The at least two source/drain features are disposed in the second region and are laterally arranged to each other. The one or more channel layers are disposed in the second region and connect the at least two source/drain features. The gate structure is disposed in the second region and engages the one or more channel layers and interposes the at least two source/drain features. The first conductive feature is disposed in the second region and is electrically coupled to the at least two source/drain features. The second conductive feature is disposed in the second region and is electrically coupled to the at least two source/drain features through the first conductive feature. The alignment mark is disposed in the first region and includes a first dielectric feature and a third conductive feature lining a bottom and a sidewall of the first dielectric feature.

20 Claims, 34 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2009/0121322 A1* | 5/2009 | Ozawa ............ H10D 1/66 438/622 |
| 2015/0236142 A1* | 8/2015 | Laven ............ H10D 62/83 257/66 |
| 2016/0163810 A1* | 6/2016 | Huang ............ H10D 30/63 257/329 |

* cited by examiner

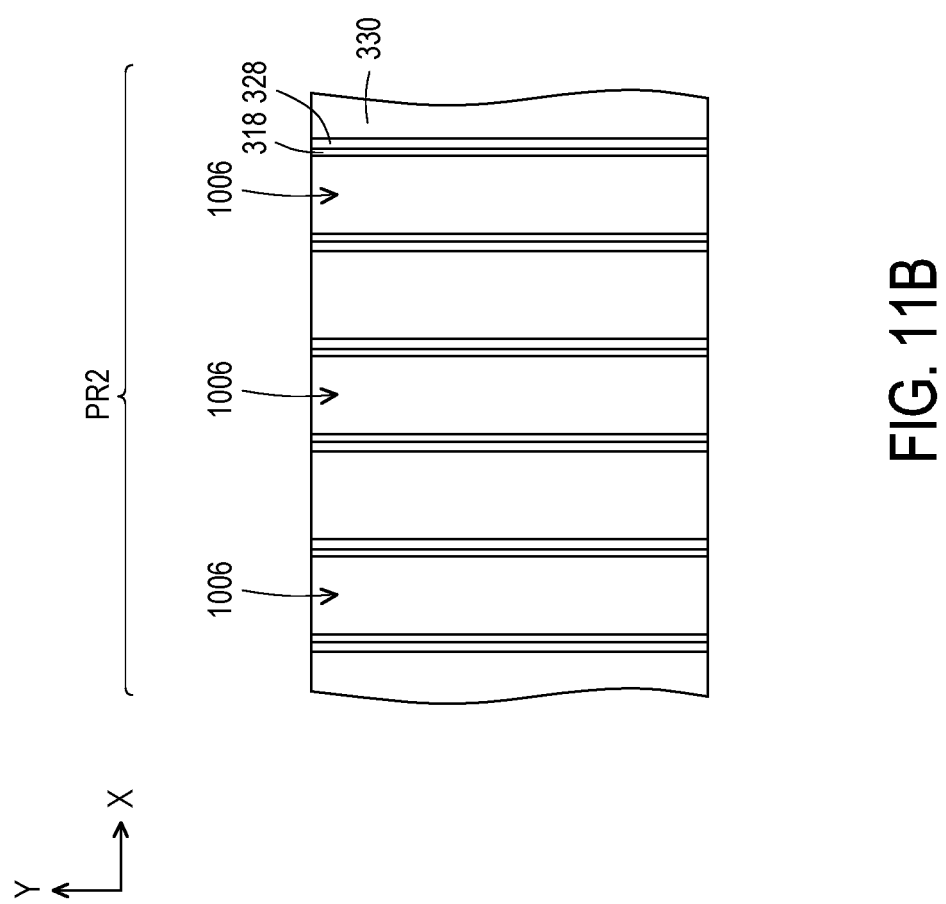

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced increased complexity to the semiconductor manufacturing process. Thus, the realization of continued advances in ICs and devices calls is for similar advances is needed in semiconductor manufacturing processes and technology.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11B and FIG. 12B are schematic horizontal cross-sectional views of a portion of the semiconductor device depicted in FIG. 11A and FIG. 12A, respectively.

DETAILED DESCRIPTION

Figure 1A:
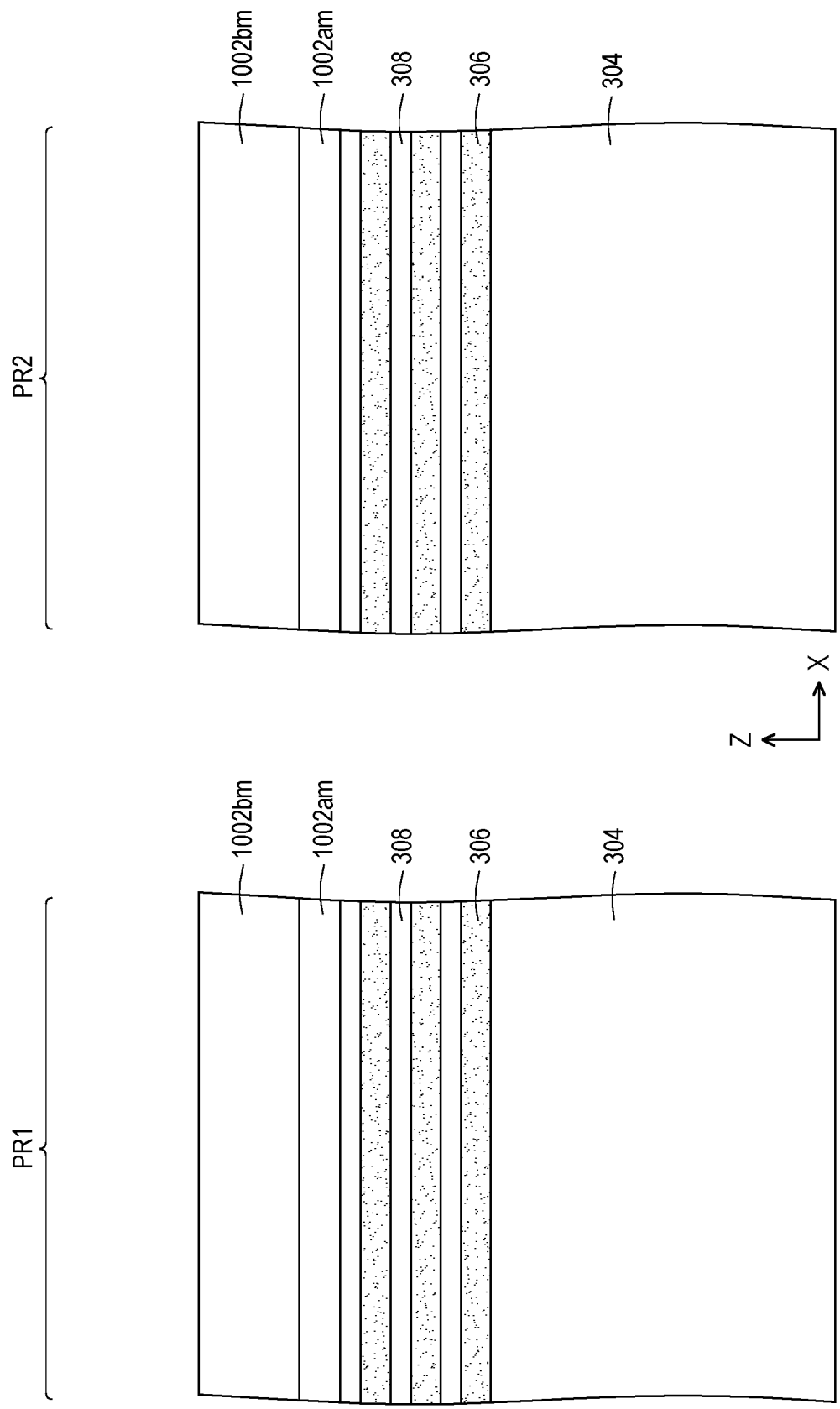
FIGS. 1A, 2A, 3A, 4A, 5A, 6A, 7A, 8A, 9A, 10A, 11A, 12A, 13A, 14A and 15A are schematic first vertical cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

It should be appreciated that the following embodiment(s) of the disclosure provides applicable concepts that can be embodied in a wide variety of specific contexts. The specific embodiment(s) discussed herein is merely illustrative and is related to a structure containing one or more than one semiconductor device including a peripherical component (s)/feature(s) in a peripherical region, and is not intended to limit the scope of the disclosure. In accordance with some embodiments, the semiconductor device has a device region and a peripherical region next to the device region, where the semiconductor device includes a substrate with devices in the device region and alignment marks in the peripherical region, first conductive features standing on and being electrically coupled to the devices in the device region, and an interconnect over the substrate. In the case, second conductive features of the interconnect overly and are electrically coupled to the devices in the device region through the first conductive features, where the first and second conductive features do not overly the alignment marks in the peripherical region. In some embodiment, the alignment marks includes a metal component, a first dielectric component stacked on the metal component and a second dielectric layer stacked on the first dielectric component. In the case, a planarization process involving the alignment marks may be promoted due to the eliminations to several process issues (such as metal pealing, planarizing loading, etc.) are achieved, thereby opening to more options for a material selection of the metal component.

The disclosure describes semiconductor devices, such as field-effect transistors (FETs), such as planar FETs, tunnel field-effect transistors (TFETs), fin-type FETs (FinFETs), gate all around (GAA) transistors, or a nanowire transistor. In accordance with some embodiments, the semiconductor device may be or include a portion of a planar FET and/or a TFET device, which may include a silicon body standing on a substrate, and a gate is standing on the silicon body (i.e., the channel region) providing control from a top side of the channel region. In accordance with some embodiments, the semiconductor device may be or include a portion of a finFET device, which may include a thin (vertical) fin of silicon body on a substrate, and a gate is wrapped around the fin (i.e., the channel region) providing control from three sides of the channel region. In accordance with some embodiments, the semiconductor device is or includes a portion of a nanostructure transistor device. The nanostructure transistor device may include a GAA transistor device or a nanowire transistor, which may include a gate structure wrapping around (e.g., engaging) the perimeter of one or more nanostructures (i.e., channel regions) for improved control of channel current flow. In some embodiments, the semiconductor device is formed on bulk silicon substrates. Still, the semiconductor device may be formed on a silicon-on-insulator (SOI) substrate, a germanium-on-insulator (GOI) substrate, a silicon germanium substrate, or a Group III-V semiconductor substrate. Also, in accordance with some embodiments, the silicon substrate may include other conductive layers or other semiconductor elements, such as transistors, diodes or the like. The embodiments are not limited in this context. The semiconductor device may be included in microprocessors, memories, and/or other integrated circuits (IC). Accordingly, it is understood that additional processes may be provided before, during, and after the illustrated method, and that some other processes may only be briefly described herein. Also, the structures illustrated in the drawings are simplified for a better understanding of the concepts of the disclosure. For example, although the figures illustrate the structure of the semiconductor device, it is understood the semiconductor device may be part of an IC that further includes a number of other devices such as resistors, capacitors, inductors, fuses, etc. On the other hand, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. In one embodiment, a sacrificial layer is formed over a substrate and patterned using a photolithography process. In one embodiment, spacers are formed alongside the patterned sacrificial layer using a self-aligned process. In one embodiment, the sacrificial layer is then removed, and the remaining spacers may then be used to pattern the GAA structure.

FIGS. 1A, 2A, 3A, 4A, 5A, 6A, 7A, 8A, 9A, 10A, 11A, 12A, 13A, 14A, 15A, and 16A are schematic first vertical cross-sectional views of various stages in a manufacturing method of a semiconductor device 10 in accordance with some embodiments of the disclosure. FIGS. 1B, 2B, 3B, 4B, 5B, 6B, 7B, 8B, 9B, 10B, 11B, 14B, 15B, and 16B are schematic second vertical cross-sectional views of a portion of the semiconductor device 10 depicted in FIGS. 1A, 2A, 3A, 4A, 5A, 6A, 7A, 8A, 9A, 10A, 11A, 14A, 15A, and 16A, respectively. FIG. 12B and FIG. 13B are schematic horizontal cross-sectional views of a portion of the semiconductor device 10 depicted in FIG. 12A and FIG. 13A, respectively. FIG. 15C is a schematic horizontal cross-sectional view of the semiconductor device 10 depicted in FIG. 15A. FIG. 15D is a schematic, enlarged first vertical cross-sectional view of a portion of the semiconductor device 10 outlined in a dashed box W as shown in FIG. 15A. In embodiments, the manufacturing method is part of a wafer level packaging process. It is to be noted that the process steps described herein cover a portion of the manufacturing processes used to fabricate the semiconductor device involving a peripherical component(s) such as an alignment mark, a (seal) ring structure, low density circuitry, thickness monitor pad, the like, or combinations thereof. The embodiments are intended to provide further explanations but are not used to limit the scope of the disclosure. In the disclosure, it should be appreciated that the illustration of components throughout all figures is schematic and is not in scale. The elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, in the drawings are illustrated the orthogonal axes (X, Y and Z) of the Cartesian coordinate system according to which the views are oriented; however, the disclosure is not specifically limited thereto. For example, the schematic first vertical cross-sectional views of FIGS. 1A, 2A, 3A, 4A, 5A, 6A, 7A, 8A, 9A, 10A, 11A, 12A, 13A, 14A, 15A, 15D, and 16A are taken along a X-Z plane, the schematic second vertical cross-sectional views of FIGS. 1B, 2B, 3B, 4B, 5B, 6B, 7B, 8B, 9B, 10B, 11B, 14B, 15B, and 16B are taken along a Y-Z plane, and the schematic horizontal cross-sectional views of FIGS. 12B, 13B, and 15C are taken along a X-Y plane, where the X-Z plane, the Y-Z plane and the X-Y plane are substantially perpendicular to one other.

Figure 1B:
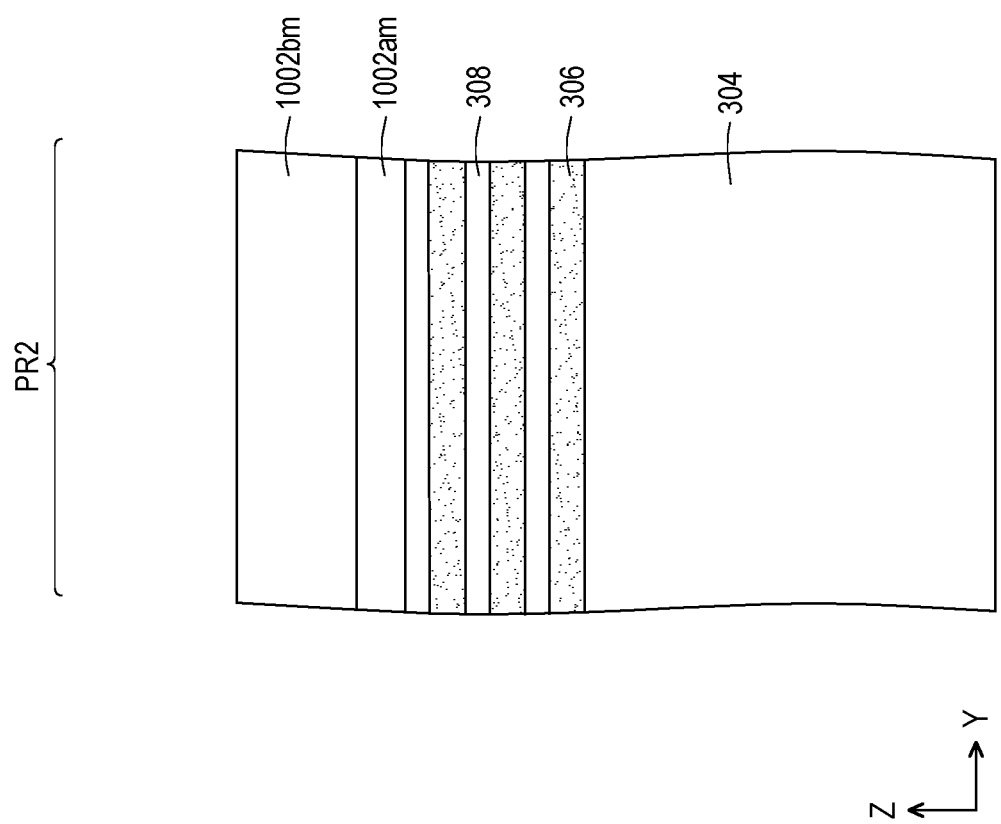
FIGS. 1B, 2B, 3B, 4B, 5B, 6B, 7B, 8B, 9B, 10B, 13B, 14B and 15B are schematic second vertical cross-sectional views of a portion of the semiconductor device depicted in FIGS. 1A, 2A, 3A, 4A, 5A, 6A, 7A, 8A, 9A, 10A, 11A, and 14A, respectively.

Referring to FIG. 1A and FIG. 1B, in some embodiments, a stack of first and second semiconductor layers (306 and 308) may be formed on a semiconductor substrate 304. In some embodiments, the semiconductor substrate 304 includes bulk semiconductor substrate (e.g., wafer) such as a crystalline silicon substrate, and may be doped (e.g., p-type or n-type semiconductor substrate) or undoped. In one embodiment, the semiconductor substrate 304 comprises a silicon-on-insulator substrate or a germanium-on-insulator substrate. In certain embodiments, the semiconductor substrate 304 includes one or more doped regions or various types of doped regions, where the doped regions may be configured for an n-type FET, or alternatively, configured for a p-type FET, depending on design requirements. In some embodiments, the doped regions are doped with p-type and/or n-type dopants. For example, the p-type dopants are boron, indium, aluminum, or gallium, and the n-type dopants are phosphorus or arsenic. In some embodiments, the semiconductor substrate 304 includes a semiconductor substrate made of other suitable elemental semiconductor, such as diamond or germanium; a suitable compound semiconductor, such as gallium arsenide (GaAs), silicon carbide (SiC), indium arsenide (InAs), or indium phosphide (InP); or a suitable alloy semiconductor, such as silicon-germanium (SiGe), gallium arsenic phosphide (GaAsP), or gallium indium phosphide (GaInP). In some embodiments, the semiconductor substrate 304 includes an oxide semiconductor material such as indium tin oxide (ITO). It is understood that different types of substrates, such as single-layer, multi-layered, or gradient substrates may be used.

In some embodiments, the semiconductor substrate 304 includes a first region PR1 and a second region PR2. In some embodiments, the first region PR1 and the second region PR2 may be adjacent to each other. The second region PR2 may be surrounded by (e.g., enclosed by) the first region PR1. In some embodiments, the first region PR1 and the second region PR2 may be spaced apart with other regions (not shown) located there-between. In some embodiments, the first region PR1 is a low-density region (which has a lower integration density and/or a lower circuitry density, such as large pitches) with components (such as alignment marks) of larger critical dimensions, while the second region PR2 is a high-density region (which has a higher integration density and/or a higher circuitry density, such as fine pitches) with components (such as active and/or passive devices) of smaller critical dimensions. In addition, the first region PR1 may further include components (such as active and/or passive devices) of larger critical dimensions; the disclosure is not limited thereto. In some embodiments, the first region PR1 is a peripheral region, while the second region PR2 is a device region. The second region PR2 may be referred to as a core region. From FIG. 1A to FIG. 16B, only portions of the first region PR1 and the second region PR2 are shown for illustration purposes.

In some embodiments, the first semiconductor layers 306 and the second semiconductor layers 308 may be alternately stacked upon one another (e.g., along a direction Z) to form a stacking structure over the semiconductor substrate 304. The first semiconductor layers 306 may be considered sacrificial layers in the sense that they are removed in the subsequent process. In some embodiments, the bottommost one of the first semiconductor layers 306 is formed on the semiconductor substrate 304, with the remaining second and first semiconductor layers (308 and 304) alternately stacked on top. However, either the first semiconductor layer 306 or the second semiconductor layer 308 may be the bottommost layer (or the layer most proximate from the semiconductor substrate 304), and either the first semiconductor layer 306 or the second semiconductor layer 308 may be the topmost layer (or the layer most distanced to the semiconductor substrate 304). The disclosure is not limited by the number of stacked semiconductor layers. A thickness (not labeled) of the respective first semiconductor layer 306 measured along the direction Z may be in a range of about 4 nm to about 12 nm. A thickness (not labeled) of the respective second semiconductor layer 308 measured along the direction Z may be in a range of about 6 nm to about 15 nm. Although other values of the thicknesses of the first and second semiconductor layers 306 and 308 are possible depending on product and process requirements.

The first semiconductor layers 306 and the second semiconductor layers 308 may have different materials (or compositions) that may provide for different oxidation rates and/or different etch selectivity between the layers. For example, the second semiconductor layers 308 are formed of the same material as the semiconductor substrate 304, while the first semiconductor layers 304 may be formed of a different material which may be selectively removed with respect to the material of the semiconductor substrate 304 and the second semiconductor layers 308. In some embodiments, the material of the first semiconductor layers 306 includes silicon germanium (SiGe). For example, germanium (Ge) may include about 15% to 35% of the first semiconductor layers 306 of SiGe in molar ratio. In some embodiments, the second semiconductor layers 308 include silicon (Si), where each of the second semiconductor layers 308 may be undoped or substantially dopant-free. A method for forming the first and second semiconductor layers 306 and 308 may include epitaxial processes. The second semiconductor layers 308 may be considered as semiconductor channel layers or channel regions. That is, the second semiconductor layers 308 may be referred to as channels of transistor (400 depicted in FIG. 13A) of the semiconductor device 10. However, the disclosure is not limited thereto, and other suitable material, or other combinations of materials for which selective etching is possible are contemplated within the scope of the disclosure.

Continued on FIG. 1A and FIG. 1B, for example, a hard mask material 1002*am* and a hard mask material 1002*bm* are subsequently formed on the stacking structure. For example, the hard mask material 1002*am* is stacked on the stacking structure, and the hard mask material 1002*bm* is stacked on the hard mask material 1002*am*. The hard mask material 1002*am* and the hard mask material 1002*bm* are individually extended along a X-Y plane to cover up the stacking structure. The hard mask material 1002*am* and the hard mask material 1002*bm* may be made of different insulating materials. For instance, materials of the hard mask material 1002*am* and the hard mask material 1002*bm* may be selected from a group consisting of silicon oxide, silicon nitride, silicon oxynitride and the like. A method for forming the hard mask material 1002*am* and the hard mask material 1002*bm* may include one or more deposition processes, such as chemical vapor deposition (CVD) process or the like.

Figure 2A:
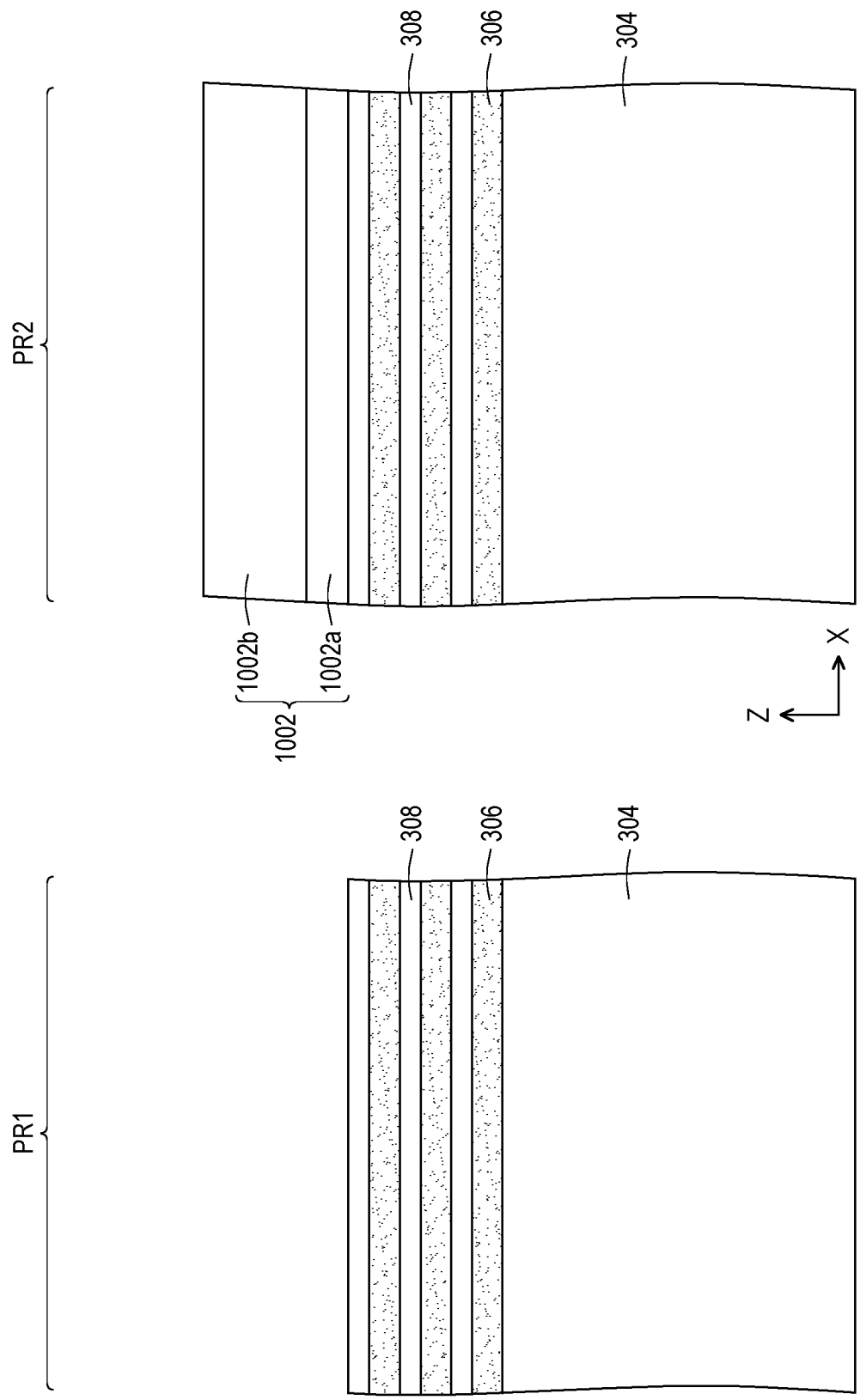
Figure 2B:
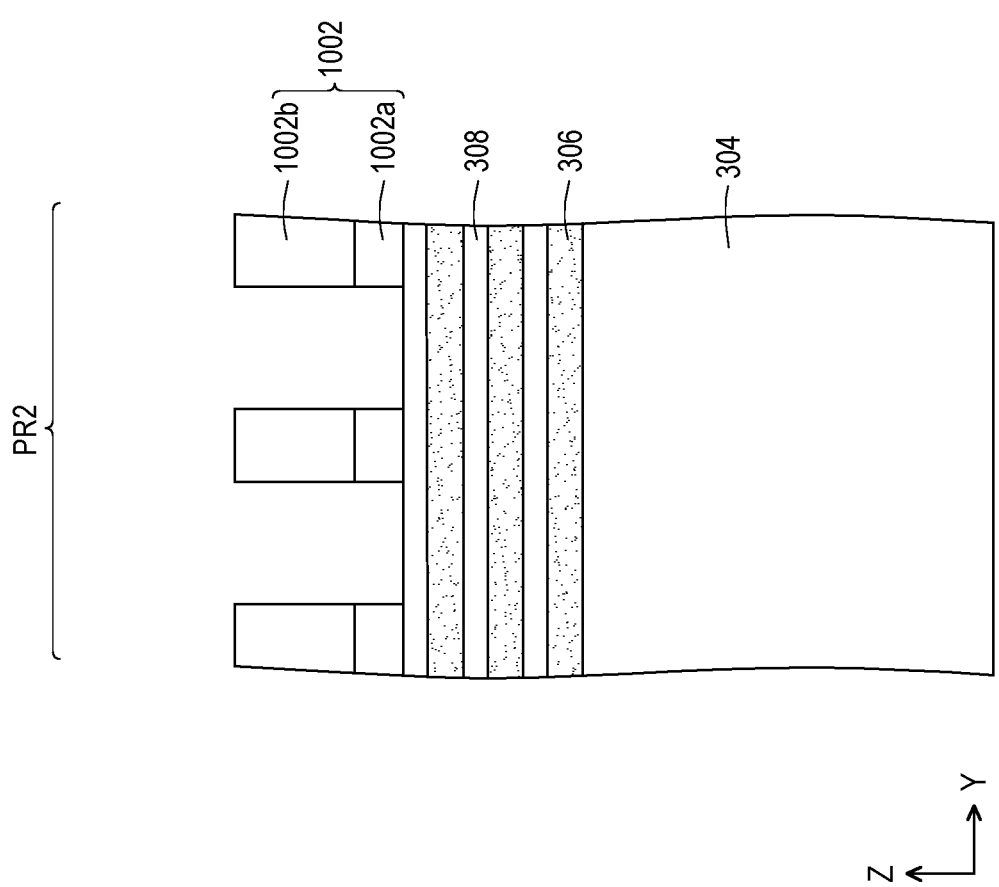

Referring to FIG. 2A and FIG. 2B, in some embodiments, the hard mask material 1002*am* and the hard mask material 1002*bm* are patterned to form a plurality of hard mask structures 1002 over a portion of the stacking structure within the second region PR2 but not other portion of the stacking structure within the first region PR1. That is, the stacking structure disposed in the first region PR1 are completely revealed by the hard mask structures 1002, and the stacking structure disposed in the second region PR2 are partially revealed by the hard mask structures 1002. In addition, in some embodiments, each hard mask structure 1002 includes a hard mask layer 1002*a* and a hard mask layer 1002*b* formed over the hard mask layer 1002*a*. In some embodiments, the hard mask structures 1002 are arranged along a direction Y, and are extending along a direction X. A method for forming of hard mask structures 1002 may include a self-aligned multiple patterning process (e.g., a self-aligned double patterning (SADP) process or a self-aligned quadruple patterning (SAQP) process). However, the disclosure is not limited thereto; alternatively, the hard mask structures 1002 each may be a single layer structure or include a structure having more than one sublayer by adjusting the number of hard mask materials formed over the stacking structure. The hard mask structures 1002 may be referred to as hard masks or hard mask patterns.

Referring to FIGS. 2A-2B and FIGS. 3A-3B, in some embodiments, a portion of the stack of first and second semiconductor layers (306 and 308) and a portion of the semiconductor substrate 304 may be removed to form first trenches (or first openings) 310T1, thereby defining a fin structure 310*a* between two adjacent first trenches 310T1. For example, the stack of first and second semiconductor layers (306 and 308) and a portion of the semiconductor substrate 304 within the first region PR1 are removed, while portions the stack of first and second semiconductor layers (306 and 308) and portions of the semiconductor substrate 304 within the second region PR2 are removed for forming the fin structures 310*a* sandwiched between two adjacent first trenches 310T1. The first trenches 310T1 may arranged along the direction Y and continuously extend along the direction X. The fin structures 310a may arranged along the direction Y and continuously extend along the direction X. In the case, the fin structures 310a and the first trenches 310T1 are alternately arranged along the direction Y, and both extend in the direction X, and shown in FIG. 3A and FIG. 3B. For example, the critical dimension (or the width measured along the direction Y, not labeled) of the respective first trench 310T1 is in a range of about 25 nm to about 80 nm. The critical dimension (or the width measured along the direction Y, not labeled) of the fin structures 310a may be in a range of about 5 nm to about 40 nm, depending on the N-type fin or the P-type fin. For example, the critical dimension of the N-type fin may be in a range of about 20 nm to about 40 nm, and the critical dimension of the P-type fin may be in a range of about 5 nm to about 20 nm. Although other values of the critical dimensions are possible depending on various device regions. It should be noted that the disclosure is not limited by the numbers of the fin structures 310a depicted in FIG. 3A and FIG. 3B, which may be adjusted according to the requirements of the circuit design. When multiple fin structures 310a are formed, the first trenches 310T1 may be disposed between any adjacent ones of the fin structures 310a.

Figure 3A:
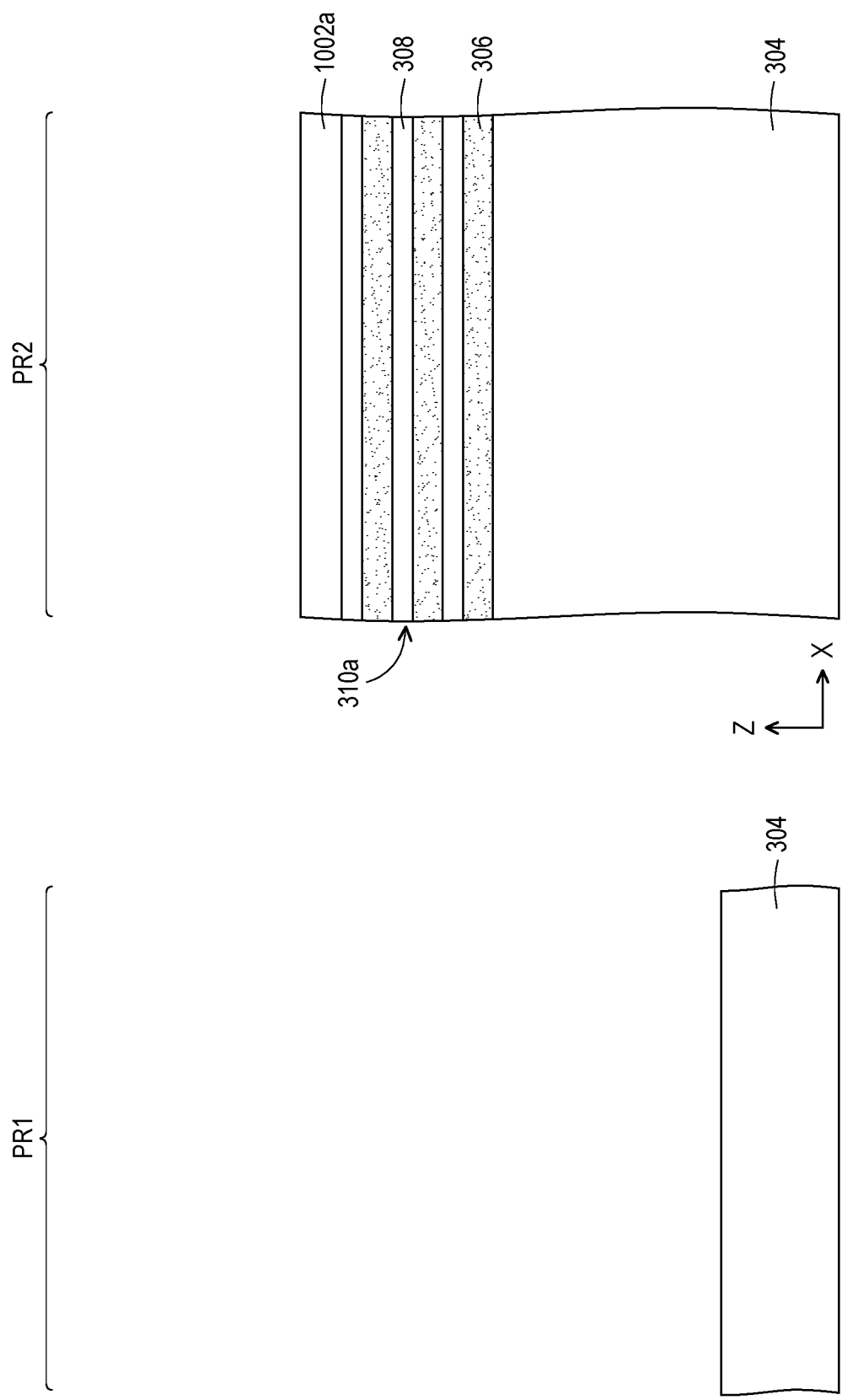
Figure 3B:
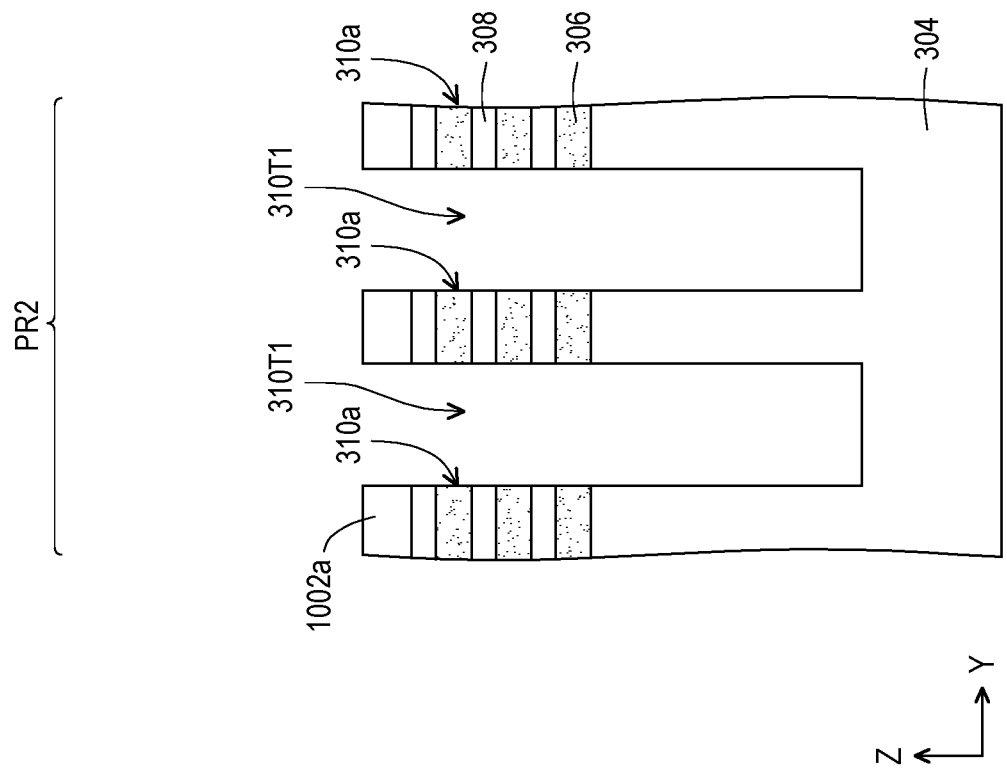

The fin structures 310a may be formed by patterning portions of the stack of first and second semiconductor layers (306 and 308) and the semiconductor substrate 304, in the second region PR2. A method for patterning the stacking structure to form the fin structures 310a may include an etching process, such as an anisotropic etching process. The etching process may be stopped when a top portion of the semiconductor substrate 304 may be removed during the etching process as shown in FIG. 3A and FIG. 3B, or be stopped when an illustrated top surface of the semiconductor substrate 304 depicted in FIG. 2A and FIG. 2B. For example, the hard mask structures 1002 are disposed over the topmost one of the second semiconductor layers 308 (also called the top semiconductor layer 308 herein). The hard mask structures 1002 are used as shadow masks to pattern exposed portions of the stack of first and second semiconductor layers (306 and 308) and the semiconductor substrate 304. In those embodiments where the hard mask structures 1002 are arranged along the direction Y and extending along the direction X, the formed fin structures 310a are also arranged along the direction Y and extending along the direction X. The fin structures 310a may be formed by etching trenches (310T1) in the stack of first and second semiconductor layers (306 and 308) and the semiconductor substrate 304, in the second region PR2. In some embodiments, the first trenches 310T1 may be parallel strips (when viewed from the top) elongated along the direction X and distributed along the direction Y.

In some embodiments, the hard mask layers 1002b of the hard mask structures 1002 are removed during the etching process (as shown in FIG. 3A and FIG. 3B), and the hard mask layers 1002a of the hard mask structures 1002 are then removed after forming the fin structures 310a (see FIG. 4A and FIG. 4B) to expose surfaces S310t (e.g., illustrated top surfaces of topmost one of the second semiconductor layers 308) of the fin structures 310a. However, the disclosure is not limited thereto; alternatively, the hard mask structures 1002 may be removed during the subsequently-performed etching process. The hard mask structures 1002 may be entirely removed right after forming the fin structures 310a.

Figure 4A:
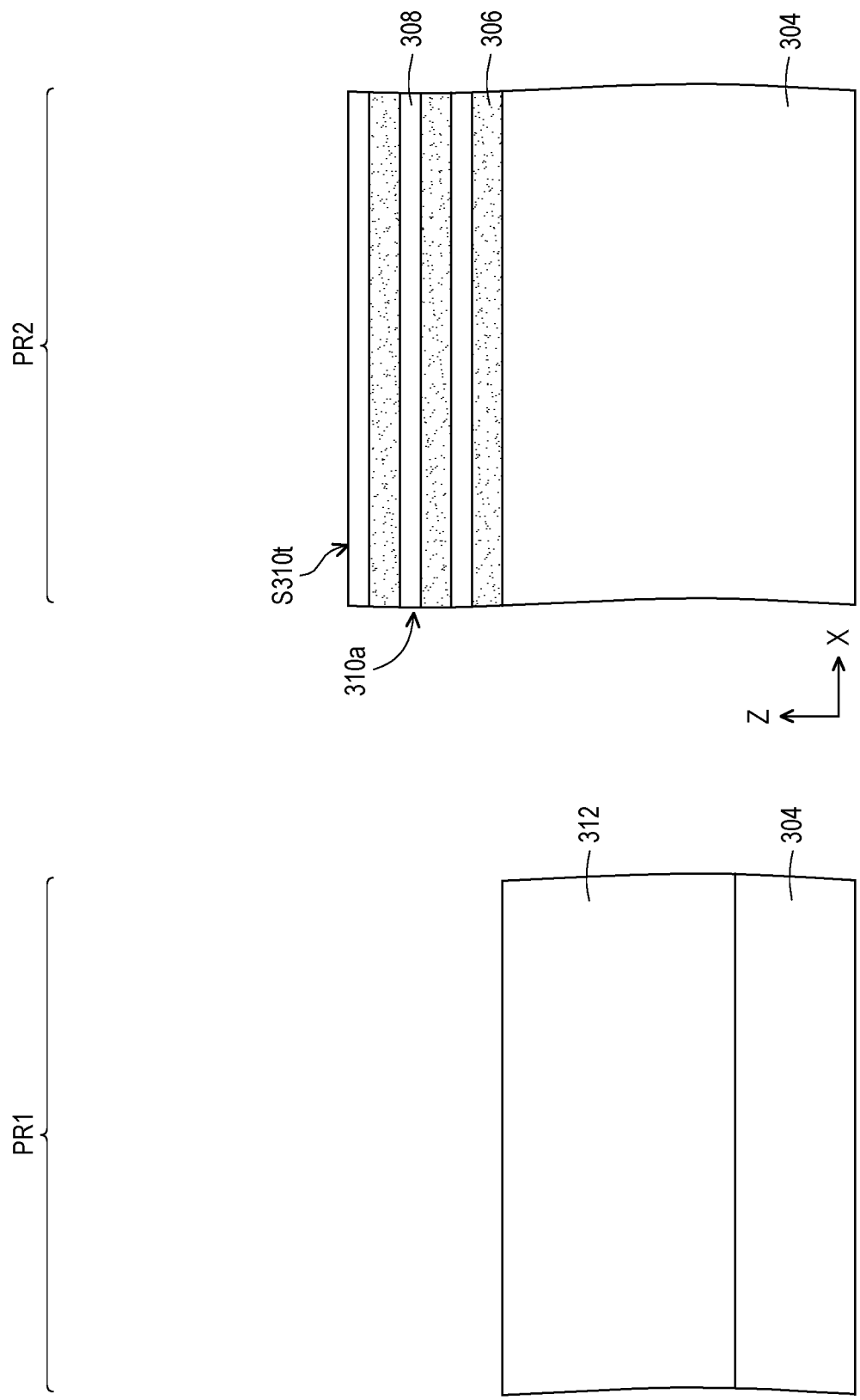
Figure 4B:
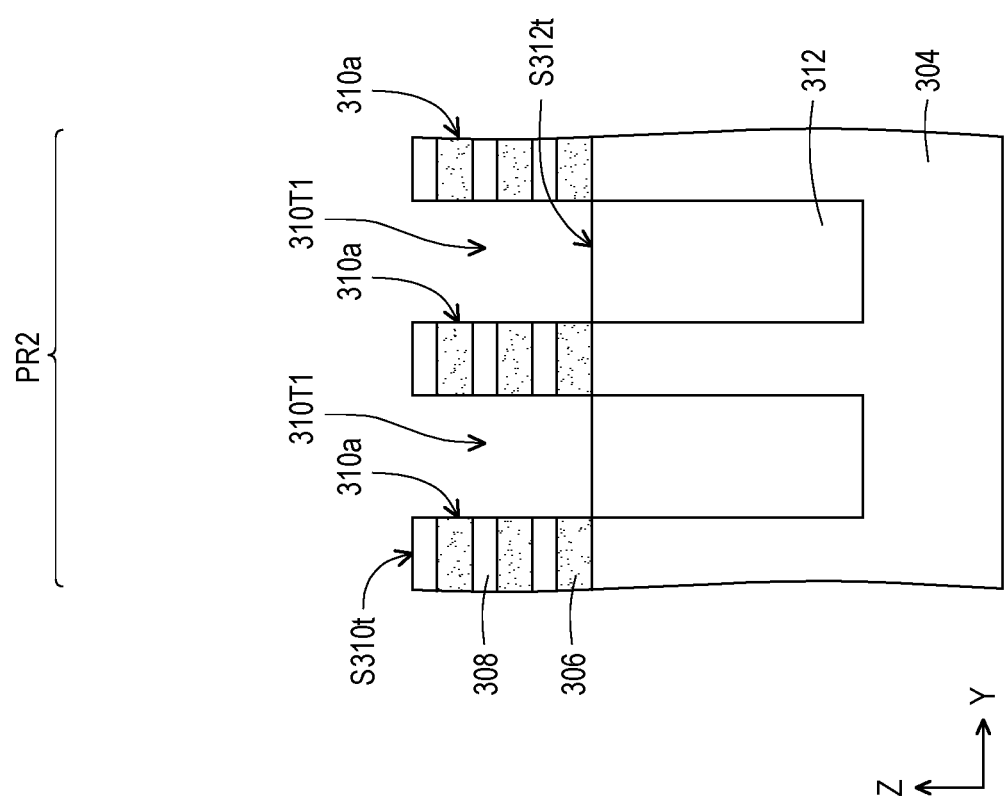

Referring to FIG. 4A and FIG. 4B, in some embodiments, a plurality of isolation structures 312 (sometimes referred to as shallow trench isolation (STI) structures) are formed over the semiconductor substrate 304 within both of the first region PR1 and the second region PR2. As shown in FIG. 4A and FIG. 4B, some of the isolation structure 312 are disposed atop the semiconductor substrate 304 within the first region PR1, while some of the isolation structures 312 are disposed in lower portions of the first trenches 310T1 within the second region PR2, in some embodiments. For example, in the second region PR2, the isolation structures 312 extend at opposing sides of a lower portion of the semiconductor substrate 304. In some embodiments where multiple fin structures 310a are provided, each of the isolation structures 312 is disposed between adjacent ones of the fin structures 310a and covers respectively a sidewall of a lower portion of the respective fin structures 310a. The isolation structures 312 may be formed of an insulation material (e.g., an oxide, a Si-based oxide (e.g., SiOC, SiOCN, or the like), a nitride, the like, any other suitable material, or combinations thereof) which may electrically isolate neighboring fin structures 310a from each other.

In some embodiments, the isolation structures 312 are formed by initially depositing a layer of insulation material (not shown) over the semiconductor substrate 304 within the first region PR1 and within the second region (e.g., in the respective first trench 310T1) and recessing the layer of insulation material using an acceptable etching process, such as one that is selective to the material of the isolation structures 312. For example, a dry etching process is performed to form the isolation structures 312 having a relatively smooth top surfaces S312t. In alternative embodiments, a wet etching process is used. Or alternatively, a dry etching process and wet etching process are both used. The isolation structures 312 may be recessed to where illustrated top surfaces S312t of the isolation structures 312 are below the illustrated top surface (not labeled) of the semiconductor substrate 304 underlying the stack structure, so that the fin structures 310a protrudes from the neighboring isolation structures 312. The illustrated top surfaces S312t of the isolation structures 312 may be a flat surface, a curved surface such as a convex surface and a concave surface, or combinations thereof, depending on the etching process. Alternatively, the isolation structures 312 may be recessed to where illustrated top surfaces S312t of the isolation structures 312 are substantially coplanar to (e.g., leveled with) the illustrated top surface of the semiconductor substrate 304 underlying the stack structure, and the fin structures 310a protrudes from the neighboring isolation structures 312.

Figure 5A:
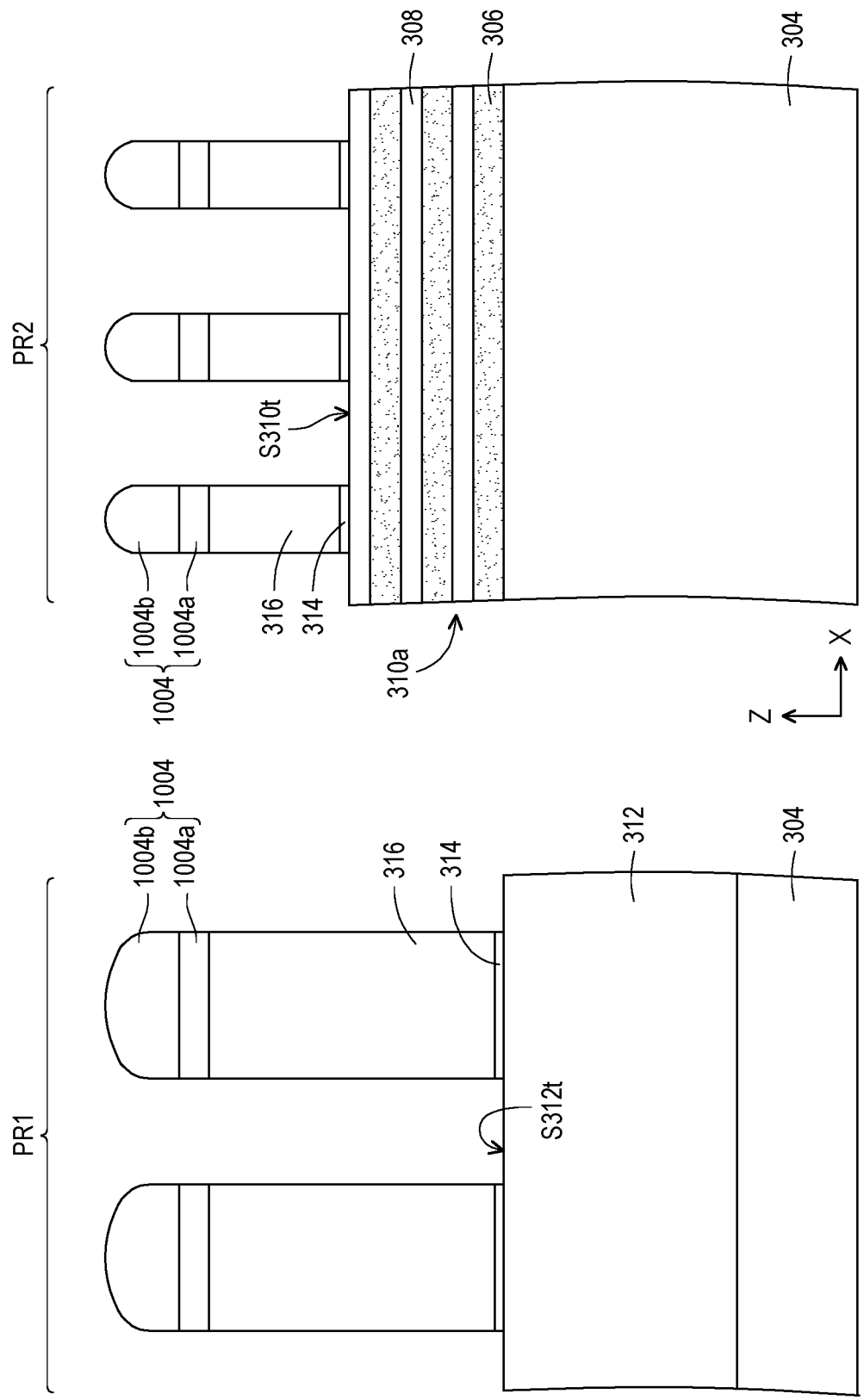
Figure 5B:
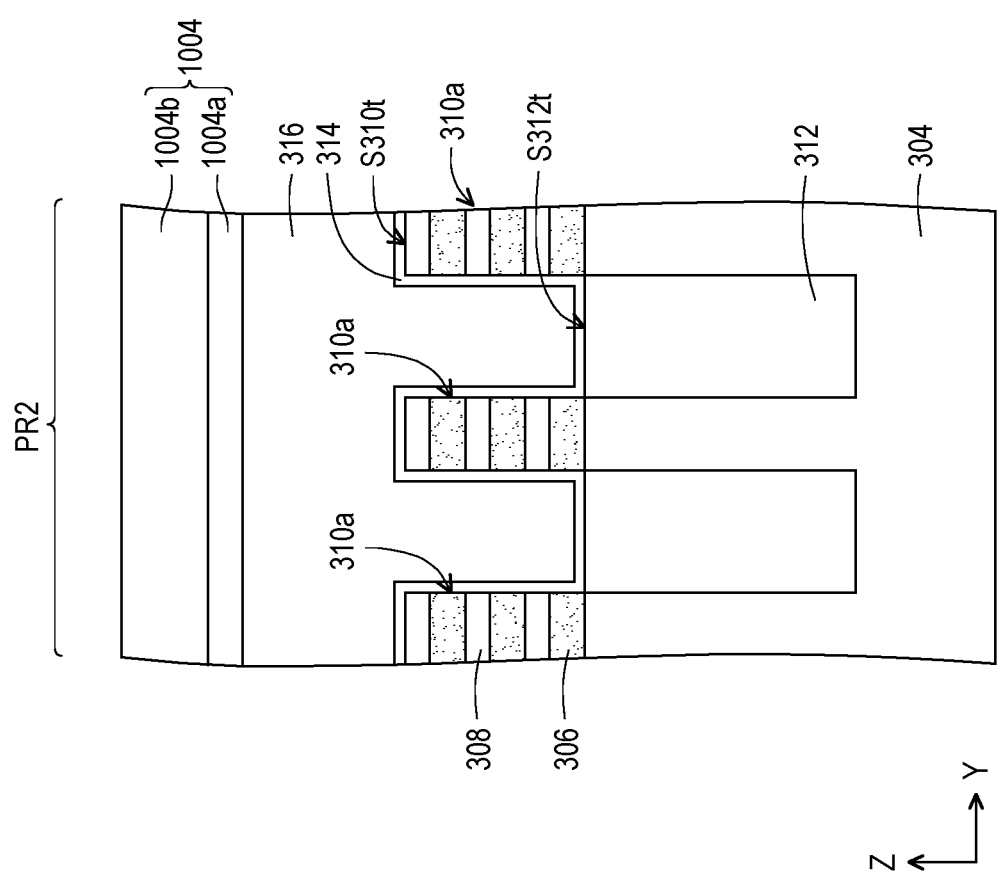

Referring to FIG. 5A and FIG. 5B, in some embodiments, sacrificial gate structures are formed on the semiconductor substrate 304 within the first region PR1 and the second region PR2. An extending direction of the sacrificial gate structures is intersected with an extending direction of the fin structures 310a, and the sacrificial gate structures cover portions of the fin structures 310a that are overlapped with the sacrificial gate structures. In those embodiments where the fin structures 310a are arranged along the direction Y and extending along the direction X, the sacrificial gate structures may be arranged along the direction X and extend along the direction Y. The sacrificial gate structures may be referred to as dummy gate structures. In some embodiments, each sacrificial gate structure includes a dummy gate dielectric layer 314 and a dummy gate electrode 316. The dummy gate dielectric layer 314 is conformally formed over the semiconductor substrate 304 within the first region PR1 and the second region PR2 and wrapping the fin structures 310a within in the second region RP2, whereas the dummy gate electrode 316 covers the dummy gate dielectric layer 314, and are formed to a height greater than a height of the fin structures 310a. In some embodiments, each sacrificial gate structure further includes a capping structure 1004 lying on the dummy gate electrode 316. The capping structure 1004 may include a capping layer 1004a and a capping layer 1004b lying above the capping layer 1004a. In some embodiments, the capping layer 1004b has rounded top corners. As shown in FIG. 5A and FIG. 5B, a lateral size of portions of the sacrificial gate structures within the first region PR1 is greater than a lateral size of portions of the sacrificial gate structures within the second region PR2, for example.

Materials of the dummy gate dielectric layer 314, the capping layer 1004a and the capping layer 1004b may respectively include silicon oxide, silicon nitride, silicon oxynitride, the like or combinations thereof, whereas a material of the dummy gate electrode 316 may include polysilicon. In addition, methods for forming the dummy gate dielectric layer 314, the capping layers 1004a, 1004b and the dummy gate electrode 316 may respectively include a deposition process, such as a CVD process or an ALD process. In each sacrificial gate structure, the dummy gate dielectric layer 314 may be referred to as a dummy gate dielectric strip, a sacrificial gate dielectric layer or a sacrificial gate dielectric strip, the dummy gate electrode 316 may be referred to as dummy gate electrode strip 316, a sacrificial gate electrode 316 or a sacrificial gate electrode strip 316, the capping structure 1004 may be referred to as a patterned mask structure, and the capping layers 1004a, 1004b may be referred to as mask strips or mask patterns.

Figure 6A:
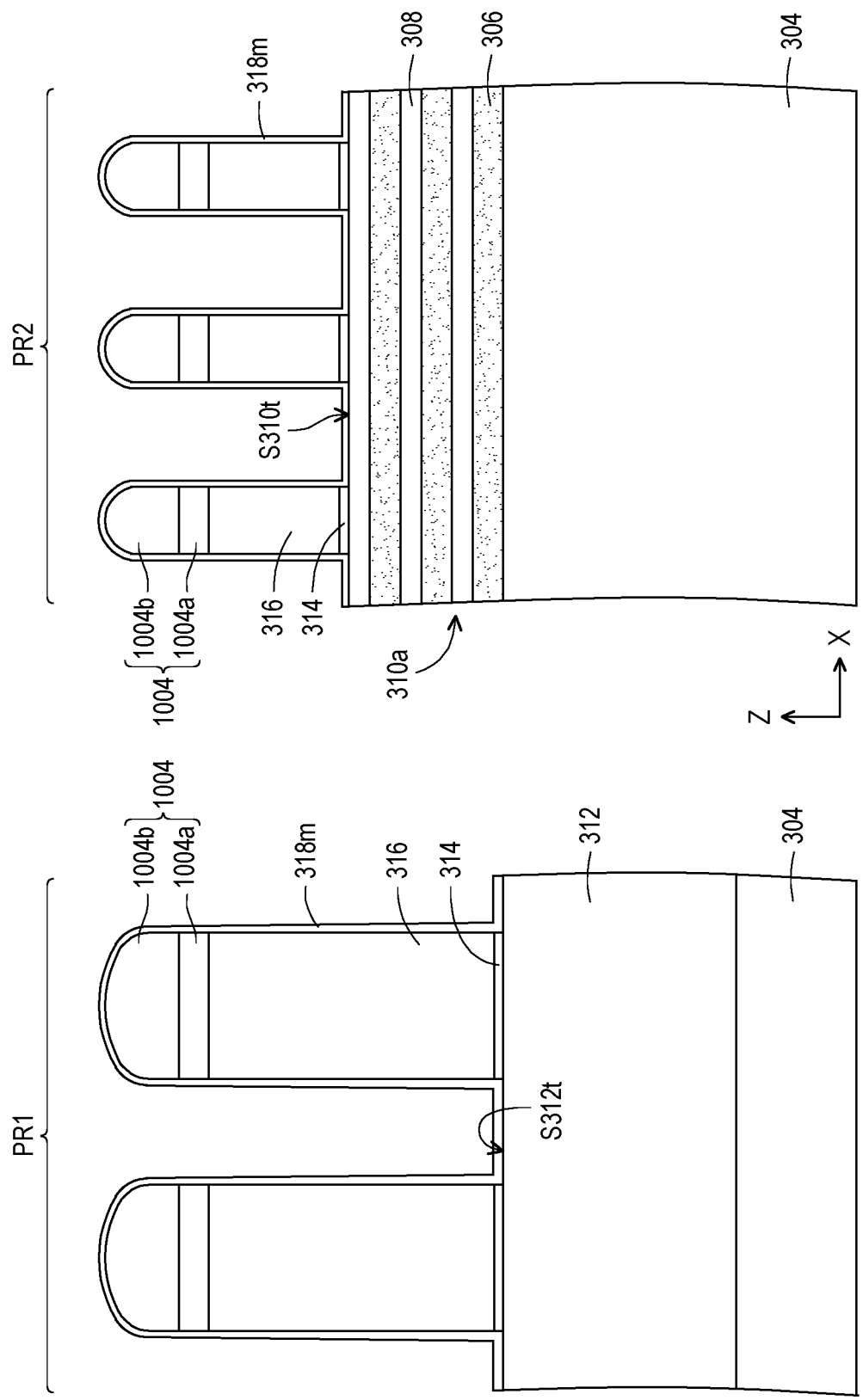
Figure 6B:
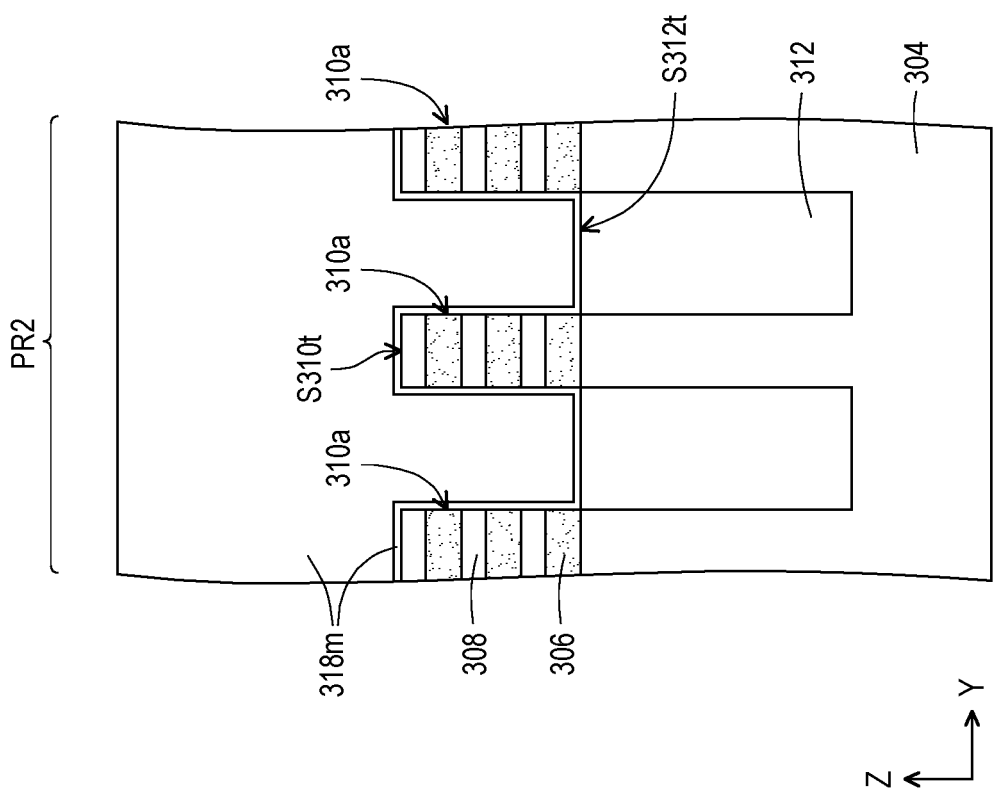

Referring to FIG. 6A and FIG. 6B, in some embodiments, a gate spacer layer 318m is formed on the structure depicted in FIG. 5A and FIG. 5B. In some embodiments, the gate spacer layer 318m is globally formed over the structure as shown in FIG. 5A and FIG. 5B. In these embodiments, the isolation structures 312, the fin structures 310a and the sacrificial gate structures (including the dummy gate dielectric layer 314, the dummy gate electrode 316, and the capping structure 1004) may be conformally covered by the gate spacer layer 318m. A material of the gate spacer layer 318m may include silicon oxide, silicon nitride, silicon carbide, silicon oxynitride (SiON), silicon carbide nitride (SiCN), silicon oxycarbide (SiOC), silicon carbide oxynitride (SiOCN), the like or combinations thereof, and a method for forming the gate spacer layer 318m may include a deposition process, such as a CVD process or an ALD process. The material of the gate spacer layer 318m is different from the materials of the isolation structure 312, the first semiconductor layers 306, the second semiconductor layers 308, and the semiconductor substrate 304, in one embodiment. However, the disclosure is not limited thereto; alternatively, the material of the gate spacer layer 318m may be the same as the material of one or more than one of the isolation structure 312, the first semiconductor layers 306, the second semiconductor layers 308, and the semiconductor substrate 304.

Figure 7A:
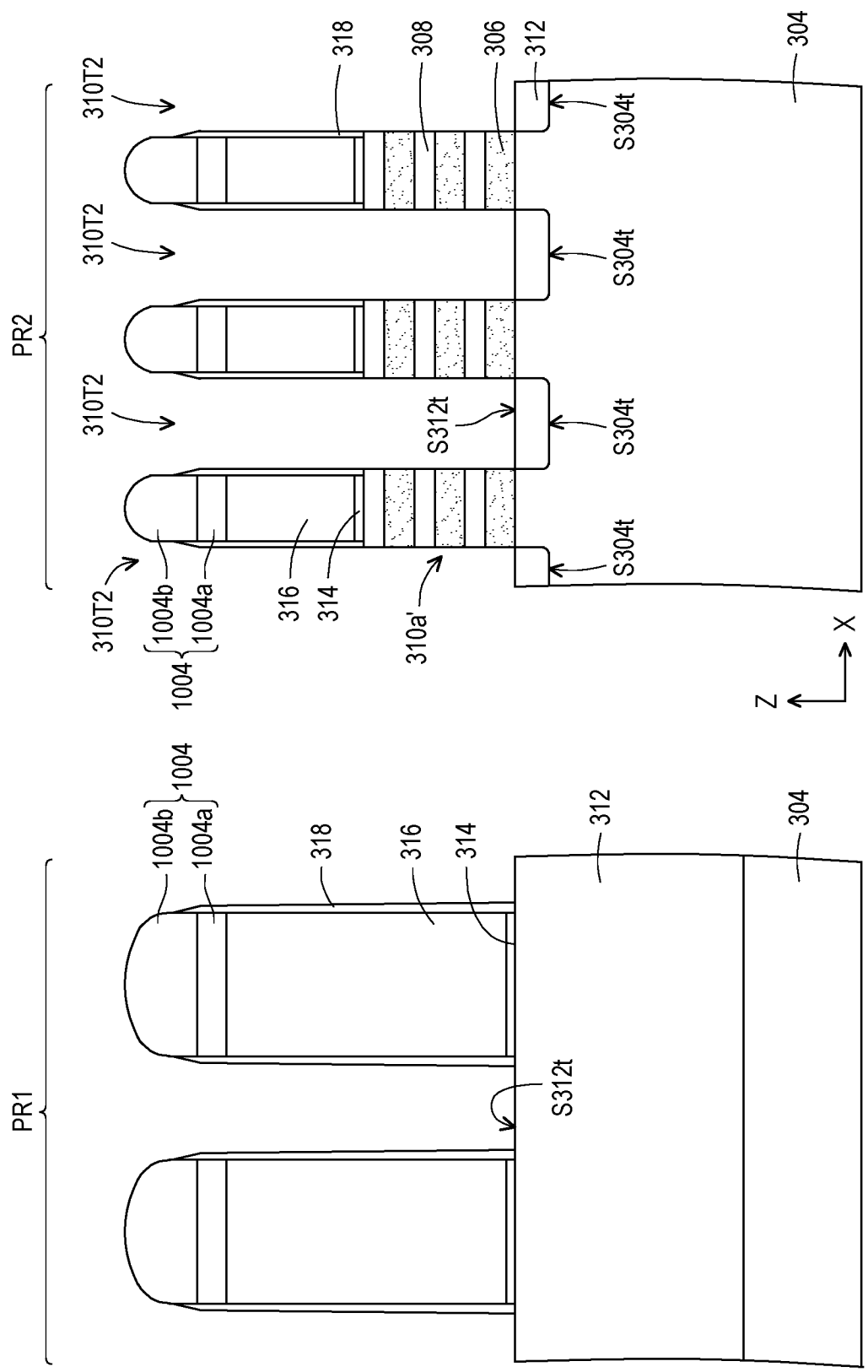
Figure 7B:
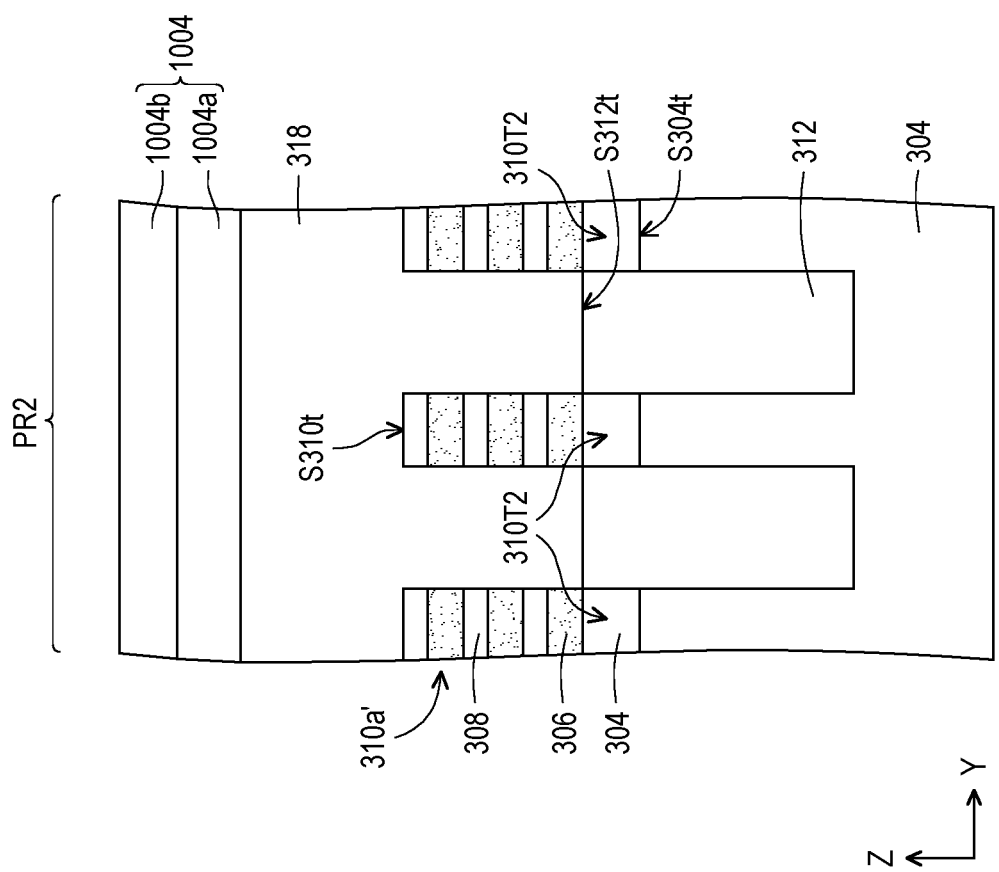

Referring to FIG. 7A and FIG. 7B, in some embodiments, some portions of the fin structures 310a and the gate spacer layer 318m are removed to form second trenches (or second openings) 310T2, thereby forming fin structures 310a' within the second region PR2 and gate spacers 318 over the semiconductor substrate 304 within the first region PR1 and the second region PR2. As shown in FIG. 7A, in the second region PR2, one sacrificial gate structure and a respective underlying one fin structure 310a' are located between two adjacent second trenches 310T2, for example. The second trenches 310T2 may arranged along the direction X and continuously extend along the direction Y. For example, the critical dimension (or the width measured along the direction X, not labeled) of the respective second trench 310T2 is in a range of about 25 nm to about 80 nm. The critical dimension (or the width measured along the direction X, not labeled) of the fin structures 310a' may be in a range of about 5 nm to about 40 nm, depending on the N-type fin or the P-type fin. For example, the critical dimension of the N-type fin may be in a range of about nm to about 40 nm, and the critical dimension of the P-type fin may be in a range of about 5 nm to about 20 nm. Although other values of the critical dimensions are possible depending on various device regions. It should be noted that the disclosure is not limited by the numbers of the fin structures 310a' depicted in FIG. 7A and FIG. 7B, which may be adjusted according to the requirements of the circuit design. When multiple fin structures 310a' are formed, the second trenches 310T2 may be disposed between any adjacent ones of the fin structures 310a'. In some embodiments, the first trenches 310T1 and the second trenches 310T2 are spatially communicated to each other.

In some embodiments, portions of the gate spacer layer 318m covering the sidewalls of the sacrificial gate structures are remained, and the rest of the sacrificial gate structures are removed, so to form the gate spacers 318. On the other hand, portions of the fin structures 310a not covered by the sacrificial gate structures 316 of the sacrificial gate structures and the gate spacers 318 are accordingly exposed. Thereafter, the exposed portions of the fin structures 310a are removed, whereas portions of the fin structures 310a covered by the gate spacers 318 and the sacrificial gate structures are remained to form the fin structures 310a'. For example, the sacrificial gate structures and the gate spacers 318 together are used as shadow masks to pattern the exposed portions of the fin structures 310a. In some embodiments, a method for removing these portions of the fin structures 310a and gate spacer layer 318m may include one or more etching processes, such as one or more anisotropic etching processes. The etching process may be stopped when a top portion of the semiconductor substrate 304 may be removed during the etching process(es) as shown in FIG. 7A and FIG. 7B, where illustrated top surfaces S314t of the semiconductor substrate 304 exposed by the second trenches 310T2 is lower than the illustrated top surfaces of the semiconductor substrate 304 within the fin structures 310a. The etching process may be stopped at the illustrated top surface S314t of the semiconductor substrate 304 exposed by the second trenches 310T2 without removing the semiconductor substrate 304 and the isolation structures 312. The isolation structures 312 may include planar top surfaces, as shown in FIG. 7A and FIG. 7B. However, the disclosure is not limited thereto.

In some embodiments, the illustrated top surface S304t of the semiconductor substrate 304 exposed by the second trenches 310T2 is lower than the illustrated top surface S312t of the isolation structure 312, as shown in FIG. 7A and FIG. 7B. However, the disclosure is not limited thereto, alternatively, the illustrated top surface S304t of the semiconductor substrate 304 exposed by the second trenches 310T2 may be above or substantially coplanar to (e.g., leveled with) the illustrated top surfaces S312t of the isolation structures 312.

Figure 8A:
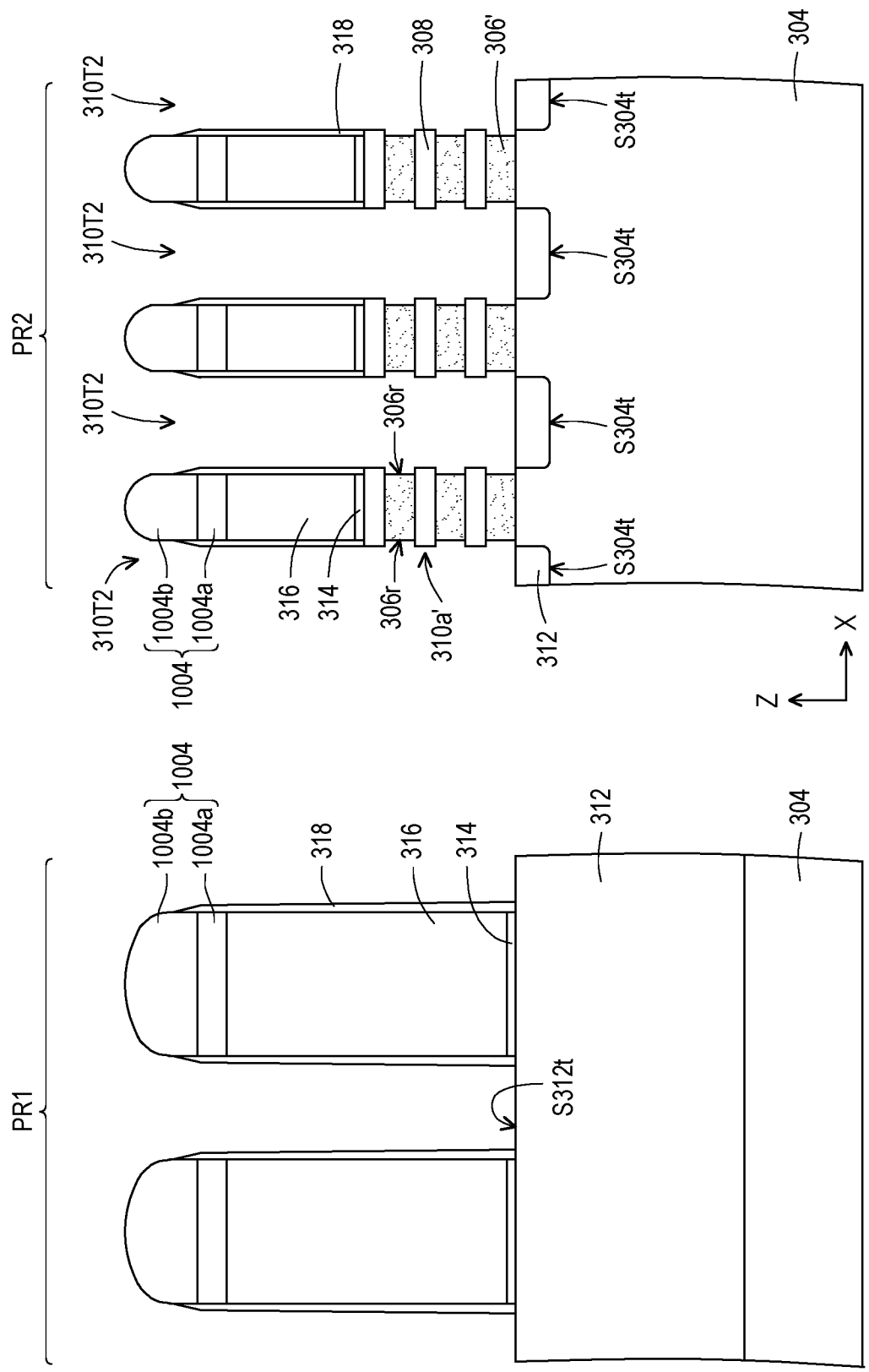
Figure 8B:
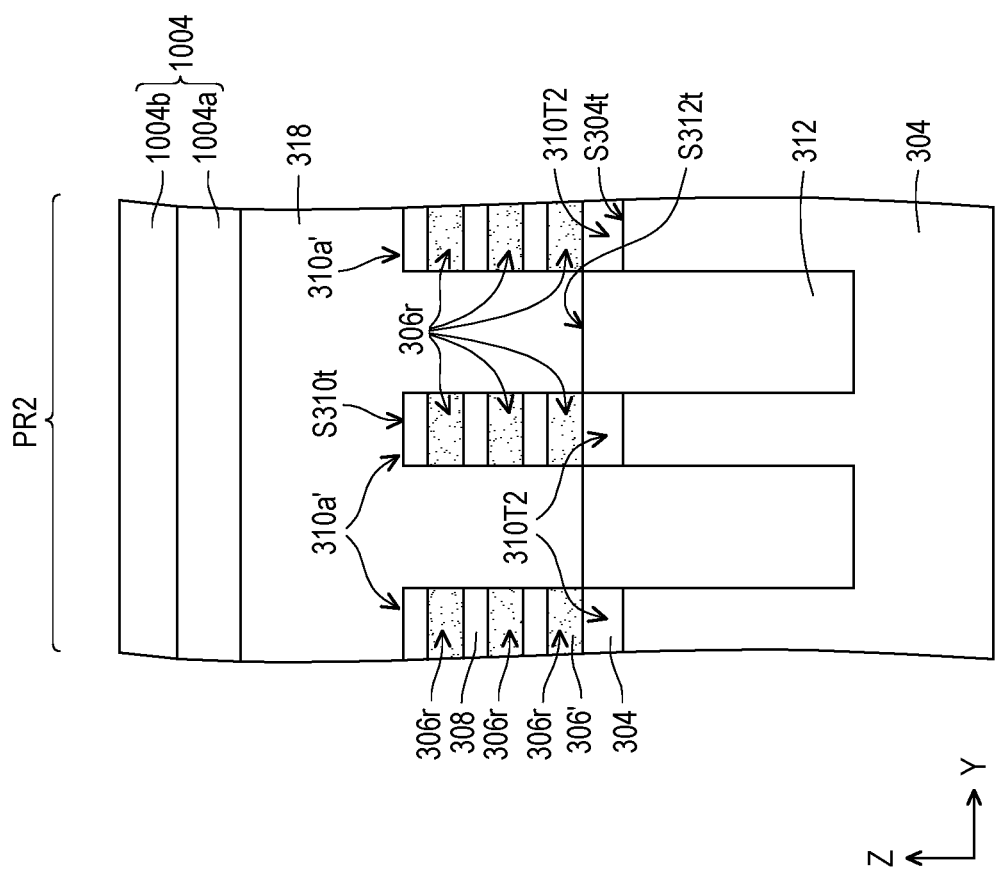

Referring to FIG. 8A and FIG. 8B, in some embodiments, the first semiconductor layers 306 are laterally recessed from the second semiconductor layers 308 and the gate spacers 318 to form first semiconductor layer 306' and a plurality of recesses 306r at opposite sides of the first semiconductor layer 306'. In the case, the recesses 306r are formed at sidewalls of the remained portions of the fin structures 310a' disposed in the second region PR2. In some embodiments, the first semiconductor layers 306 are laterally recessed from the second semiconductor layers 308 and the gate spacers 318 by a distance ranging from 0.5 nm to 1 nm. A method for lateral recessing the first semiconductor layers 306 may include an etching process, such as an isotropic etching process. By properly selecting etchants for the etching process and/or by properly selecting the materials of the first semiconductor layers 306 and the second semiconductor layers 308, the first semiconductor layers 306 can be etched without consuming the second semiconductor layers 308 and other components in the current structure. In some embodiments, the recesses 306r, the first trenches 310T1 and the second trenches 310T2 are spatially communicated to each other. The recesses 306r may be referred to as lateral recesses.

Figure 9A:
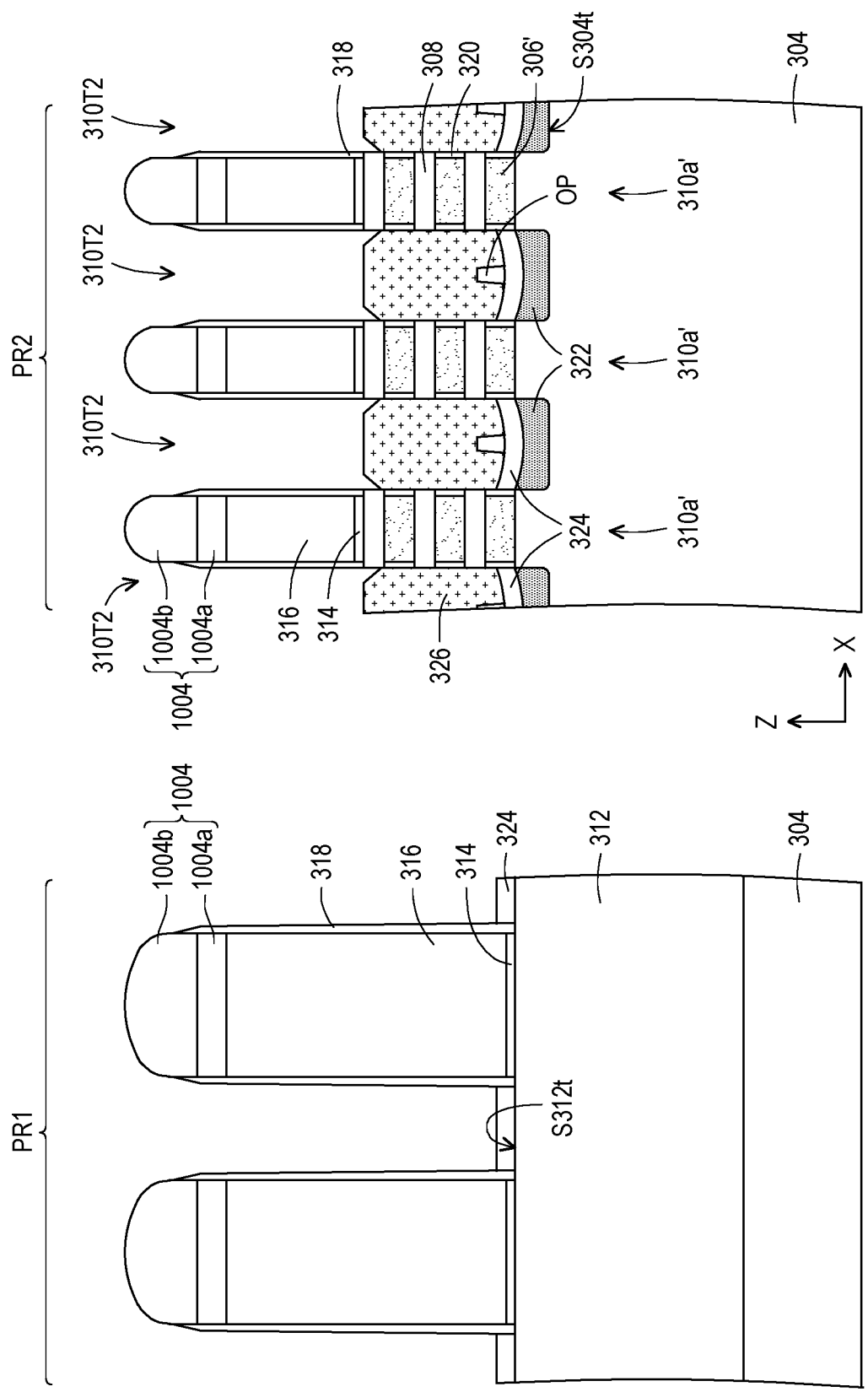
Figure 9B:
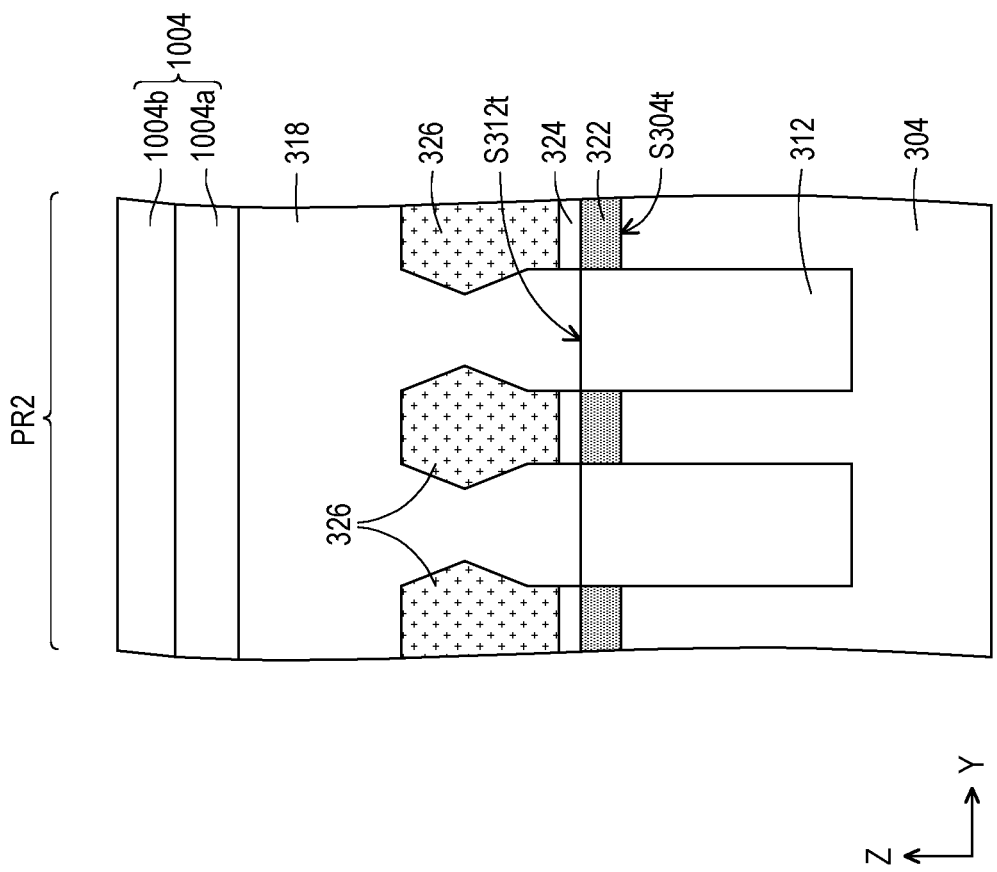

Referring to FIG. 9A and FIG. 9B, in some embodiments, a plurality of inner spacers 320 are formed in the recesses 306r by filling an insulating material in the recesses 306r at the sidewalls of the fin structures 310a', within the second region PR2. In some embodiments, exposed sidewalls of the inner spacers 320 are substantially coplanar with sidewalls of the second semiconductor layers 308 and sidewalls of the gate spacers 318. In alternative embodiments, the exposed sidewalls of the inner spacers 320 are dented from the sidewalls of the second semiconductor layers 308 and the sidewalls of the gate spacers 318. A material of the insulating material for forming the inner spacers 320 may include silicon oxide, silicon nitride, silicon carbide, silicon carbide nitride, silicon oxide carbide, silicon carbide oxynitride, or other suitable dielectric materials or combinations thereof. A method for forming the inner spacers 320 may include initially forming a material layer globally covering the structure shown in FIG. 8A and FIG. 8B, and then removing portions of this blanket layer outside the recesses 306r. In this way, the remained portions of this material layer form the inner spacers 320. In some embodiments, the material layer is formed by using a deposition process (e.g., a CVD process or an ALD process), and the portions of the material layer are removed by using an etching process (e.g., an anisotropic etching process). The inner spacers 320 may be formed from the same or different material as the gate spacers 318.

In some embodiments, a plurality of first layers 322 are formed over the semiconductor substrate 304 between the lower portion of the fin structures 310a'. In some embodiments, one first layer 322 is disposed between two adjacent isolation structures 312 arranged along the direction Y. On the other hand, each of the fin structures 310a' is disposed between two adjacent first layers 322 along the direction X. For example, as shown in FIG. 9A and FIG. 9B, the first layers 322 are disposed on (e.g., in physical contact with) the illustrated top surface of the semiconductor substrate 304 exposed by the second trenches 310T2. Alternatively, the first layers 322 may further extend onto the illustrated top surfaces S312t of the isolation structures 312, the disclosure is not limited thereto. In some embodiments, illustrated top surfaces of the first layers 322 are lower than the illustrated top surface of the semiconductor substrate 304 within the fin structures 310a'. Alternatively, the illustrated top surfaces of the first layers 322 may be substantially coplanar to (e.g., leveled with) the illustrated top surface of the semiconductor substrate 304 within the fin structures 310a'. Or alternatively, the illustrated top surfaces of the first layers 322 may be above the illustrated top surface of the semiconductor substrate 304 within the fin structures 310a'. The first layers 322 may be referred to as a bottom-up epitaxial layers (epi layers) or strained elements. The first layers 322 may include SiGe, which may be epitaxial-grown with a p-type dopant for straining a p-type FET. The p-type dopant includes boron or BF 2, and the strained materials 214 may be epitaxial-grown by LPCVD process with in-situ doping. Alternatively, the first layers 322 may include SiC, which may be epitaxial-grown with an n-type dopant for straining an n-type FET. The n-type dopant includes arsenic and/or phosphorus, and the strained materials 214 may be epitaxial-grown by LPCVD process with in-situ doping.

In some embodiments, the first layers 322 are grown to have substantially identical size. The first layers 322 may be symmetrical to one another, as shown in FIG. 9A and FIG. 9B. However, the disclosure is not limited thereto. Alternatively, the first layers 322 may be grown to have different sizes. In some embodiments, the first layers 322 located at the same side of the fin structures 310a' along the direction X and arranged along the direction Y may be grown to physically spacing away from each other, which may be considered as discrete pieces, as shown in FIG. 9A and FIG. 9B.

As shown in FIG. 9A and FIG. 9B, in some embodiments, a dielectric layer 324 is formed over the first layers 322 within the second region PR2 and the isolation structures 312 within the first region PR1. In some embodiments, the dielectric layer 324 is disposed over the semiconductor substrate 304 to cover (e.g., in physical contact with) the illustrated top surfaces of the first layers 322 and the illustrated top surfaces S312tr of portions of the isolation structures 312. In the case, the sidewalls of the fin structures 310a' and the sidewalls of the gate spacers 318 are free of the dielectric layer 324. The dielectric layer 324 may be referred to as a coverage dielectric layer or a buffer layer. A material of the dielectric layer 324 may include SiO, AlO, AlON, ZrO, HfO, TiO, ZrAlO, ZnO, SiN, SiOCN, SiCN, or other suitable dielectric materials or combinations thereof, and a method for forming the dielectric layer 324 may include a deposition process, such as a CVD process or the like. A thickness of the dielectric layer 324 measured along the direction Z may be in a range of about 1 nm to about 10 nm. Although other value of the thickness of the dielectric layer 324 is possible depending on product and process requirements. Alternatively, the dielectric layer 324 may be optional and can be omitted.

Continued on FIG. 9A and FIG. 9B, a plurality of source/drain regions 326 are formed over the semiconductor substrate 304 within the second region PR2 between the fin structures 310a, in some embodiments. In the case, the source/drain regions 326 are formed over the first layers 322 and on the dielectric layer 324, where a plurality of cavities OP are formed/trapped between the source/drain regions 326 and the dielectric layer 324 within the second region PR2. Alternatively, the cavities OP may be optionally omitted. In some embodiments, each of the fin structures 310a' is disposed between two adjacent source/drain regions 326 along the direction X. In some embodiments, illustrated top surfaces (not labeled) of the source/drain regions 326 are substantially coplanar to (e.g., leveled with) the illustrated top surfaces S310t of the fin structures 310a'. Alternatively, the illustrated top surfaces of the source/drain regions 326 may be above the illustrated top surfaces S310t of the fin structures 310a'. Or alternatively, the illustrated top surfaces of the source/drain regions 326 may be below the illustrated top surfaces S310t of the fin structures 310a'.

In some embodiments, the dielectric layer 324 is disposed between (e.g., in physical contact with) the first layers 322 and the source/drain regions 326. The source/drain regions 326 may be coupled to (e.g., connected to) the exposed surfaces of the second semiconductor layers 308 of the fin structures 310a' (along the Y-direction) and the inner spacers 320. The source/drain regions 326 may each include silicon germanium, indium arsenide, indium gallium arsenide, indium antimonide, germanium arsenide, germanium antimonide, indium aluminum phosphide, indium phosphide, any other suitable material, or combinations thereof. The source/drain regions 326 may be formed using an epitaxial layer growth process on the exposed surfaces of each of the second semiconductor layers 308 and the inner spacers 320. The material of the source/drain regions 326 may be doped with a conductive dopant. For example, a strained material is epitaxially grown with an n-type dopant (or a p-type dopant) for straining the source/drain regions 326 in the n-type region (or the p-type region). That is, the strained material is doped with the n-type dopant (or the p-type dopant) to be the source/drain regions 326 of the p-type FET (or the n-type FET). For one non-limiting example, the source/drain regions 326 include SiGe, which are epitaxial-grown with a p-type dopant for straining a p-type FET. In the case, the p-type dopant includes boron or BF 2, and the source/drain regions 326 are epitaxial-grown by LPCVD process with in-situ doping. For another non-limiting example, the source/drain regions 326 include SiC, which are epitaxial-grown with an n-type dopant for straining an n-type FET. In the case, the n-type dopant includes arsenic and/or phosphorus, and the source/drain regions 326 are epitaxial-grown by LPCVD process with in-situ doping.

In some embodiments, one first layer 322, a respective one source/drain region 326 overlying thereto, and the dielectric layer 324 (if any) disposed therebetween together may be referred to as an epitaxial structure (not labeled) of the semiconductor device 10. That is, the epitaxial structures is disposed as a multi-layered structure, with different layers having different degrees of doping. Alternatively, the epitaxial structures may be disposed as a single-layered structure. It should be noted that the epitaxial structures may have other types of configurations, while remaining within the scope of the disclosure. The epitaxial structures may be referred to as source/drain structures or source/drain features, epitaxial layers (epi layers), strained elements, or strained structures. The epitaxial structures may be referred to as sources/drains of the transistor (400 depicted in FIG. 12A) of the semiconductor device 10.

In some embodiments, the source/drain regions 326 are grown to have substantially identical size. The source/drain regions 326 may be symmetrical to one another, as shown in FIG. 9A and FIG. 9B. However, the disclosure is not limited thereto. Alternatively, the source/drain regions 326 may be grown to have different sizes. In some embodiments, the source/drain regions 326 located at the same side of the fin structures 310a' along the direction X and arranged along the direction Y may be grown to physically spacing away from each other, which may be considered as discrete pieces, as shown in FIG. 9B. Alternatively, the source/drain regions 326 located at the same side of the fin structures 310a' along the direction X and arranged along the direction Y may be grown to physically connected to each other, which may be together considered as an integral piece. The source/drain regions 326 may be coupled to the exposed surfaces of the second semiconductor layers 308 of the fin structures 310a' (along the Y-direction) and the inner spacers 320.

Figure 10A:
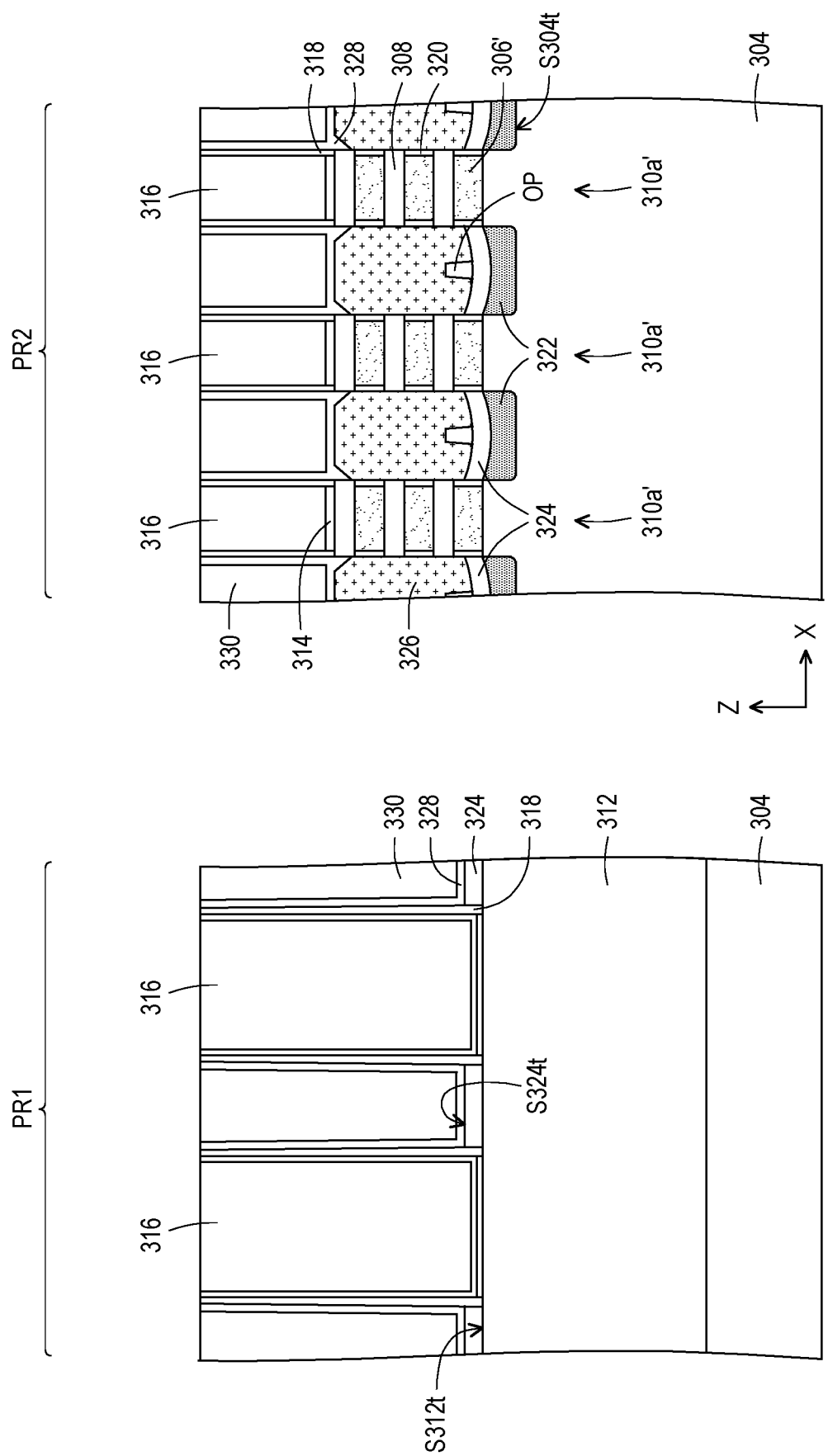
Figure 10B:
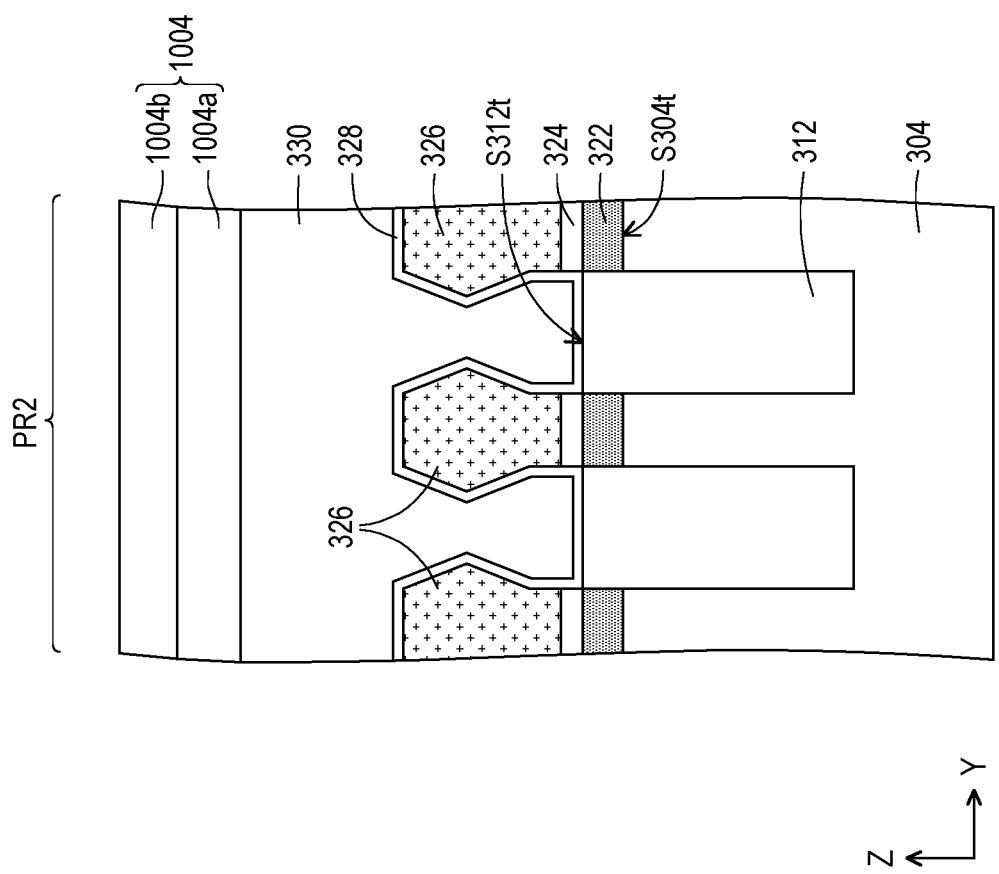

Referring to FIG. 10A and FIG. 10B, in some embodiments, a dielectric layer 328 is globally formed on the structure depicted in FIG. 9A and FIG. 9B. The dielectric layer 328 may be completely disposed on the source/drain regions 326, the dielectric layer 324, the isolation structures 312, the sacrificial gate structures, the gate spacers 318, and the capping structure 1004 exposed therefrom, as shown in FIG. 10A and FIG. 10B. The dielectric layer 328 includes, for example, a suitable material such as silicon nitride, silicon oxynitride, silicon nitride with oxygen or carbon elements, the like or combinations thereof. In some embodiments, the dielectric layer 328 is deposited by using processes such as CVD (e.g., high density plasma (HDP) CVD or sub-atmospheric CVD (SACVD)), ALD, molecular layer deposition (MLD), or other suitable methods. The dielectric layer 328 functions as a protection layer that effectively blocks water or moisture from penetrating into the elements underlying thereto or damages from the subsequent process(es) such as an etching process. The dielectric layer 328 may be referred to as a protection layer, an etch stop layer or a contact etch stop (CES) layer. A thickness of the dielectric layer 328 may be in a range of about 1 nm to about 5 nm. Although other value of the thickness of the dielectric layer 328 is possible depending on product and process requirements.

Thereafter, an interlayer dielectric (ILD) layer 330 is formed over the dielectric layer 328, in some embodiments. For example, the ILD layer 330 is disposed at opposing sides (along the Y-direction) of each sacrificial gate structures to overlay the epitaxial structures, the dielectric layer 324 and the isolation structures 312 exposed therefrom, with the dielectric layer 328 disposed therebetween. The ILD layer 330 may be formed of a dielectric material such as silicon oxide, silicon oxide, silicon nitride, silicon oxynitride, silicon carbonitride, silicon carbide oxynitride, spin-on glass (SOG), tetraethylorthosilicate (TEOS) oxide, phosphosilicate glass (PSG), borosilicate glass (BSG), boron-doped phosphosilicate Glass (BPSG), fluoride-doped silicate glass (FSG), undoped silicate glass (USG), carbon doped silicon oxide (e.g., SiCOH), polyimide, and/or a combination thereof. In some alternative embodiments, the ILD layer 330 may include low-K dielectric materials. It should be noted that the low-k dielectric materials are generally dielectric materials having a dielectric constant lower than 3.9. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the ILD layer 330 may include one or more dielectric materials. In some embodiments, the ILD layer 330 is formed to a suitable thickness by CVD such as flowable chemical vapor deposition (FCVD), HDP CVD, SACVD, spin-on, sputtering, or other suitable methods.

In some embodiments, a material layer of the dielectric layer 328 may be conformally formed over the source/drain regions 326, the isolation structures 312, the dielectric layer 324, the sacrificial gate structures, the gate spacers 318, and the capping structures 1004. Next, a material layer of the ILD layer 330 may be formed over the dielectric layer 328 and fills the second trenches 310T2. Subsequently, a planarization process (e.g., a grinding process, a chemical mechanical polishing (CMP) process, an etching process, or combinations thereof) may be performed to remove excess materials of the dielectric layer 328 and the ILD layer 330. In some embodiments, the planarization process may also remove the capping structures 1004 to expose illustrated top surfaces of the dummy gate electrodes 316 of the sacrificial gate structures. After the planarization process, the illustrated top surfaces of the ILD layer 330 and the dielectric layer 328 may be substantially leveled with (e.g., coplanar to) illustrated top surfaces of the sacrificial gate structures (e.g., the illustrated top surfaces of the dummy gate electrodes 316) and illustrated top surfaces of the gate spacers 318, within process variations.

In certain cases, parts of top portions of the sacrificial gate structures may also be removed during the planarization process. After the planarization process, a cleaning step may be optionally performed, for example to clean and remove the residue generated from the planarization process.

Figure 11A:
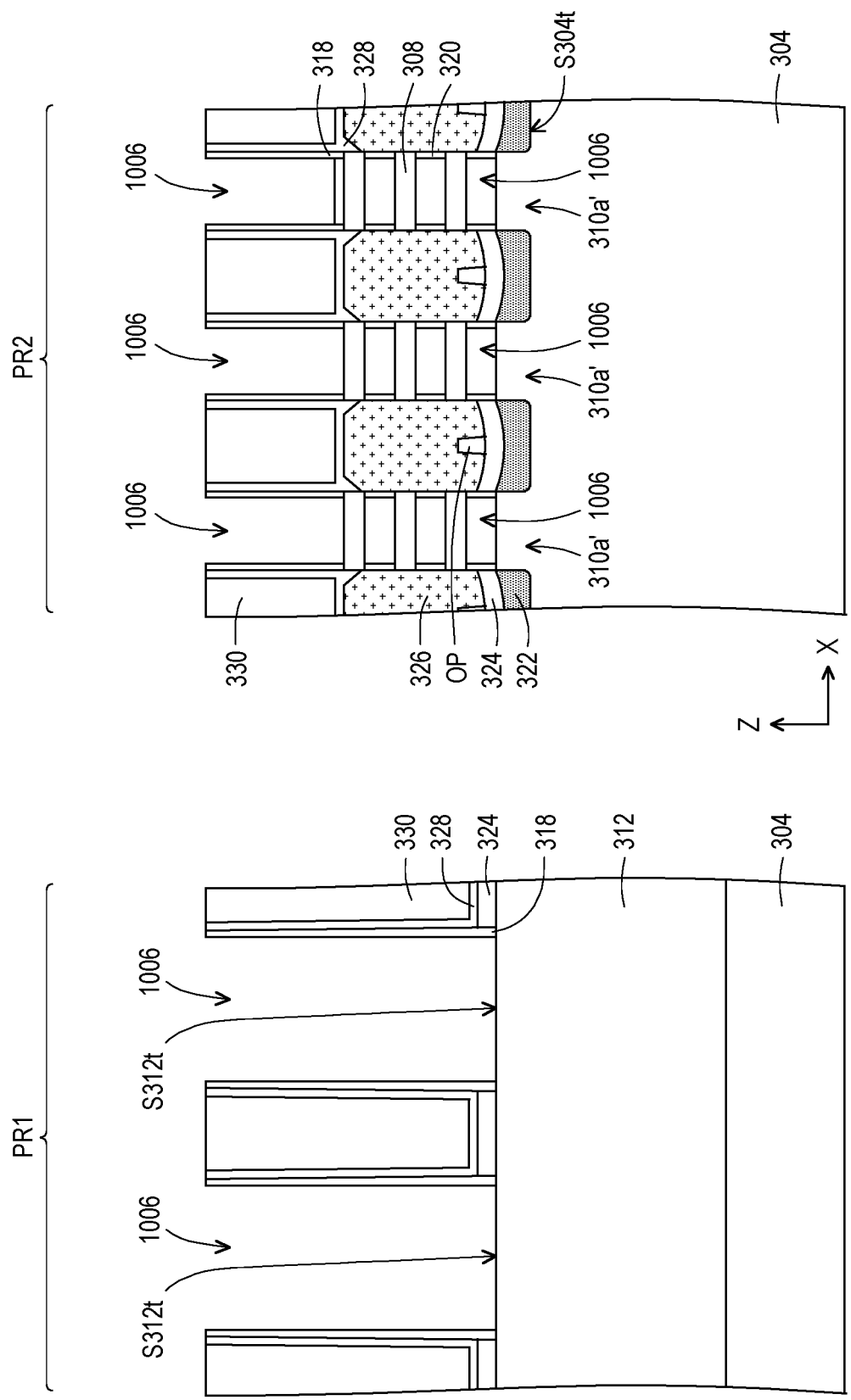

Referring to FIG. 11A and FIG. 11B, in some embodiments, after the sacrificial gate structures are accessibly revealed, the dummy gate electrodes 316 and the dummy gate dielectric layers 314 of the sacrificial gate structures are removed to form first recesses between a respective pair of the gate spacers 318, and the first semiconductor layer 306' are also removed to second recesses between a respective pair of the inner spacers 320, within the first region PR1 and the second region PR2. The removal process may include an etching process (such as a dry etching, a wet etching, or a combination thereof) or any other suitable process. In some embodiments, a method for removing the first semiconductor layer 306' may include an isotropic etching process. By properly selecting etchants for the etching process and/or properly selecting the materials of the first semiconductor layer 306' and the second semiconductor layers 308, the first semiconductor layer 306' can be etched without removing the second semiconductor layers 308 and other components in the current structure. In the case, the isotropic etching process is a selective etching process, while leaving the second semiconductor layers 308 substantially intact. During the removal process, the ILD layer 330 and the dielectric layer 328 may protect the source/drain regions 326, the isolation structure 312, and the dielectric layer 324. In some embodiments the first recesses and the second recesses are spatially communicated to each other to form cavities 1006. That is, the second semiconductor layers 308 of the fin structures 310a' are accessibly released. The respective, illustrated bottom surface and illustrated top surface of each of the second semiconductor layers 308 may be exposed (e.g., accessibly revealed) by the cavities 1006, as shown in FIG. 11A and FIG. 11B. In addition, inner sidewalls of the inner spacers 320 previously covered by the first semiconductor layer 306' are currently exposed in the cavities 1006.

Figure 12A:
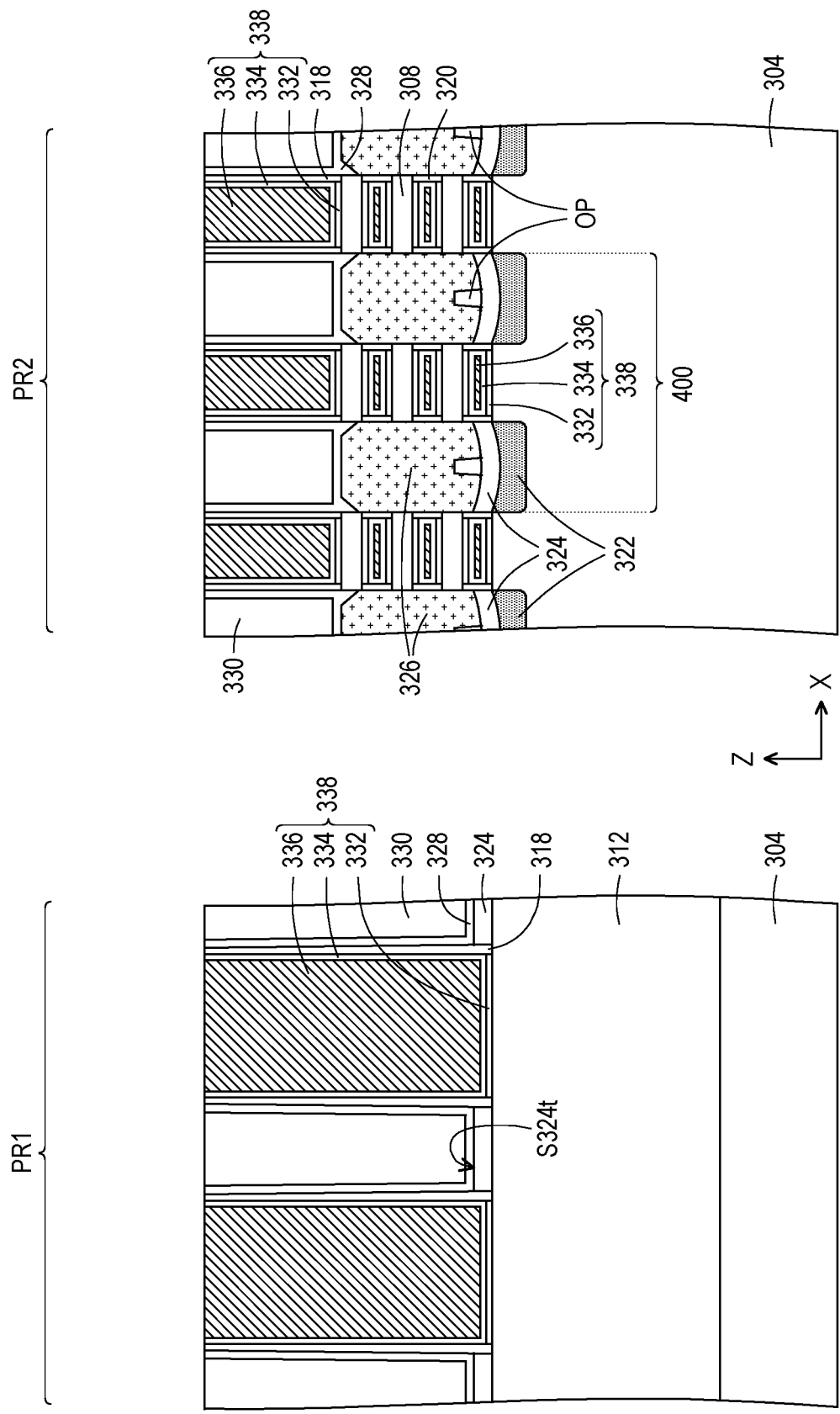
Figure 12B:
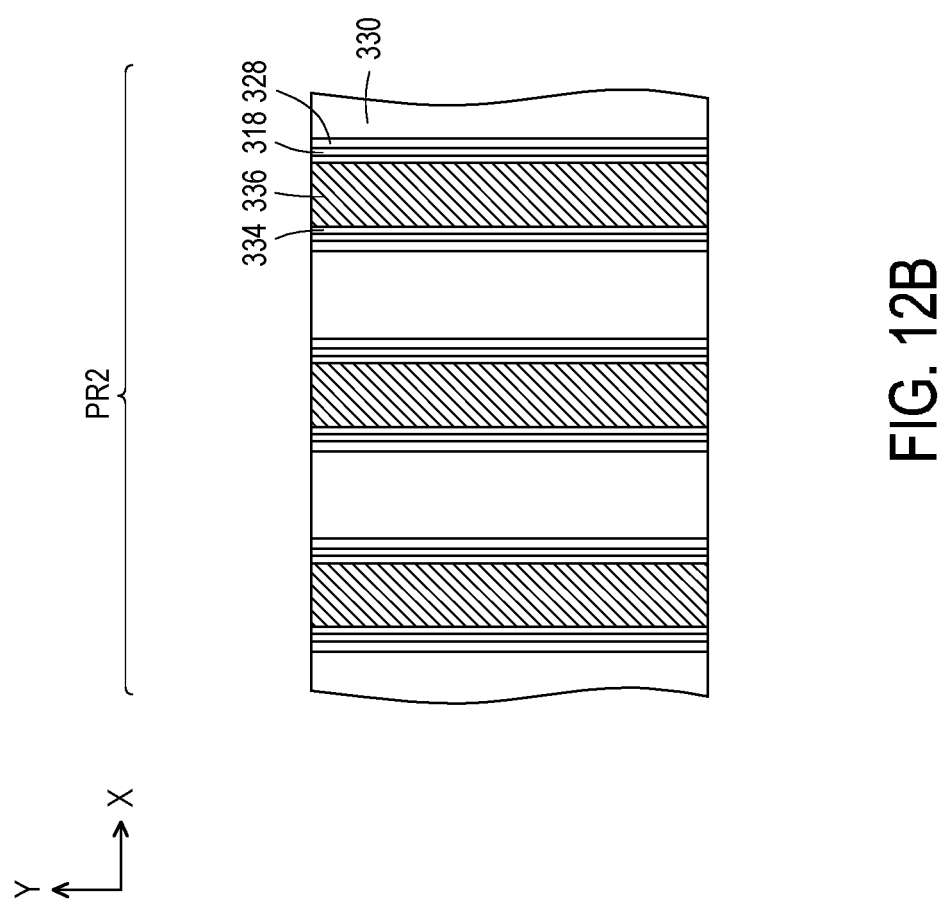

Referring to FIG. 12A and FIG. 12B, in some embodiments, interfacial (IL) layers 332, gate dielectric layers 334, and gate electrodes 336 are formed in the cavities 1006 defined between adjacent gate spacers 318 and the inner spacers 320, with the first region PR1 and the second region PR2. One interfacial layer 332, one gate dielectric layer 334, and one gate electrode 336 disposed in one cavity 1006 may be collectively referred to as a gate structure 338 of the transistor (400 depicted in FIG. 12A) of the semiconductor device 10. That is, the previously shown sacrificial gate structures may be regarded as being replaced by the gate structures 338. Up to here, a plurality of transistors 400 included in the semiconductor device 10 is manufactured. The transistors 400 respectively include one of the gate structures 338, the second semiconductor layers 308 in this gate structure 338, and a pair of source/drain structures 326 at opposite sides of this gate structure 338. In addition, the transistors 400 each may further include the inner spacers 320 in this gate structure 338 and a pair of gate spacer 318 at the opposite sides of this gate structure 338. The number and configurations of the transistors 400 formed in the semiconductor device should not be limited by the embodiments or drawings of this disclosure. It is understood that the number and configurations of the transistors 400 may have different material or configurations depending on product designs.

As shown in FIG. 12A and FIG. 12B, the interfacial layers 332 are lining on the exposed, illustrated top and illustrated bottom surfaces of the second semiconductor layers 308 and the illustrated top surface of the semiconductor substrate 304 underlying the second semiconductor layers 308, for example. In the case, the gate dielectric layers 334 are lining on exposed surfaces of the interfacial layers 332, the inner spacers 320 and the gate spacers 318, and the gate electrodes 336 fill the remainder space in these cavities 1006. The interfacial layers 332 may include a dielectric material such as silicon oxide layer or silicon oxynitride. In some embodiments, the interfacial layers 332 may be formed by a deposition process such as ALD, CVD, and/or other suitable deposition methods. The interfacial layers 332 may be adapted to provide a good interface between the semiconductor surface (i.e., the second semiconductor layers 308) and a gate insulator (i.e., the gate dielectric layers 334) and to suppress the mobility degradation of the channel carrier of the transistors 400. A material of the gate dielectric layer 334 may include a high-k dielectric material. In some embodiments, low-k dielectric materials are generally dielectric materials having a dielectric constant greater than about 4, greater than about 12, greater than about 16, or even greater than about 20. Examples of the high-k dielectric material may include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 334 may be one-layer structure or a multi-layer structure of different sublayers. The gate dielectric layer 334 may be referred to as a high-k dielectric layer. A method for forming the gate dielectric layers 334 may include a deposition process, such as a CVD process or an ALD process. A material of the gate electrodes 336 may include polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. A method for forming the gate electrodes 336 may include a deposition process (e.g., a CVD process or an ALD process), a plating process (e.g., an electrical plating process or an electroless plating process) or a combination thereof. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, one or more work function layer (not shown) is formed between each gate dielectric layer 334 and the overlying gate electrode 336. A material of the work function layer may include p-type work function metals or n-type work function metals. For example, the p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. For example, the n-type work function metals include Ti, Ag, TaAl, TaAlC, TiAlN, TaC, TaCN, TaSiN, Mn, Zr, other suitable n-type work function materials, or combinations thereof. In some embodiments, the method of forming the work function layer includes performing at least one suitable deposition technique, such as CVD (e.g., PECVD), ALD (e.g., remote plasma atomic layer deposition (RPALD), plasma enhanced atomic layer deposition (PEALD), molecular beam deposition (MBD), or the like. The work function layer may serve the purpose of adjusting threshold voltage (Vt) of the transistors 400.

Figure 13A:
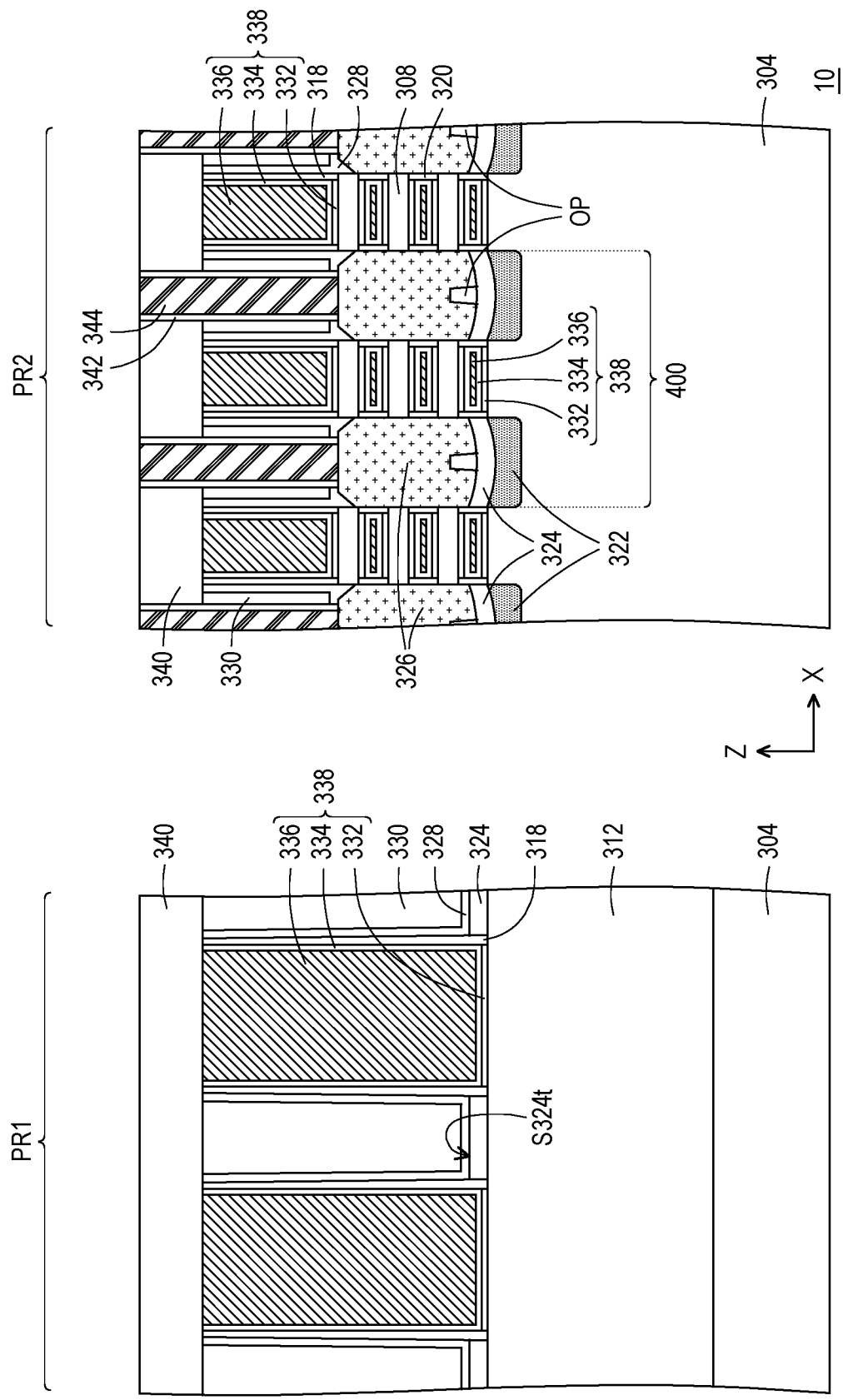
Figure 13B:
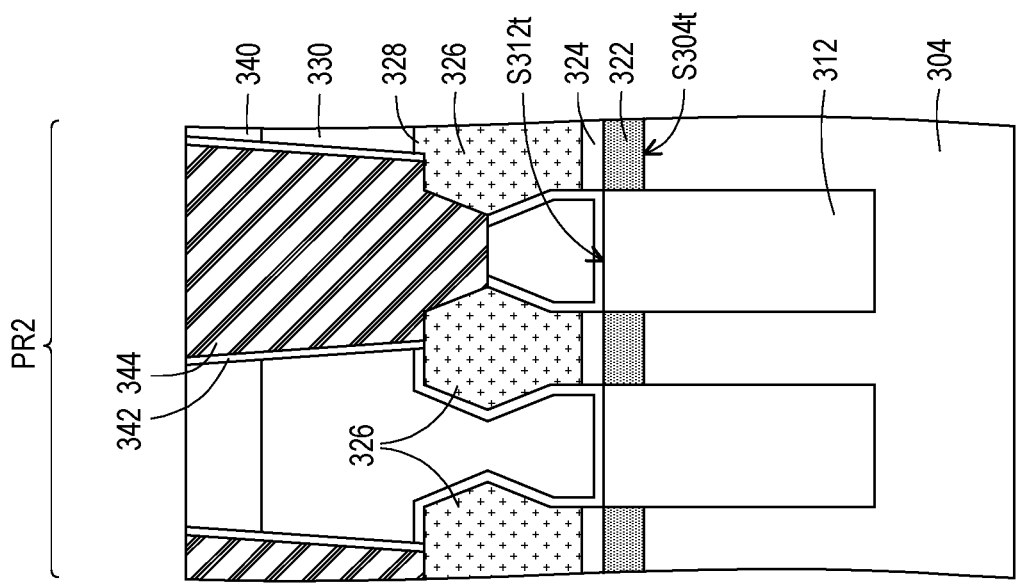

Referring to FIG. 13A and FIG. 13B, in some embodiments, an ILD layer 340 is formed over the structure depicted in FIG. 12A and FIG. 12B, within the first region PR1 and the second region PR2. For example, the ILD layer 340 is disposed on the transistor 302 and extends onto the illustrated top surfaces of the ILD layer 330, the dielectric layer 328 and the gate spacers 318. The formation and material of the ILD layer 340 is similar to or substantially identical to the formation and material of the ILD layer 330 as described in FIG. 10A and FIG. 10B, and thus are not repeated herein for brevity. Thereafter, in the second region PR2, a plurality of though openings (not labeled) may be formed in the ILD layer 340 and further extend into the ILD layer 330 and the dielectric layer 328 to expose (e.g., accessibly reveal) portions of the source/drain regions 326, as shown in FIGS. 13A and 13B. The through openings may be formed by patterning the ILD layer 340, the ILD layer 330 and the dielectric layer 328 with lithography and etching processes. The etching process may include a dry etching, a wet etching, or a combination thereof.

In some embodiments, after forming the through openings in the ILD layer 340, the ILD layer 330 and the dielectric layer 328, a plurality of contact plugs 344 are formed in the through openings to couple with the source/drain regions 326. The contact plugs 334 are disposed on (e.g., in physical contact with) the source/drain regions 326, respectively. The contact plugs 344 may be referred to as metallization contacts, metal contacts or metallic contacts to the source/drain regions 326. For example, the contact plugs 344 electrically coupled to the source/drain regions 326 are referred to as source/drain contacts. In some embodiments, the contact plugs 344 may include ruthenium (Ru), cobalt (Co), copper (Cu), titanium (Ti), titanium nitride (TiN), tantalum (Ta), tantalum nitride (TaN), molybdenum (Mo), nickel (Ni), a combination of thereof, or the like. The contact plugs 344 may be formed by, for example, plating such as electroplating or electroless plating, CVD such as PECVD, ALD, and PVD, a combination thereof, or the like. Seed layers (not shown) may be optionally formed before forming the contact plugs 344 to line sidewalls and illustrated bottoms of the through openings. That is, for example, each of the seed layers covers an illustrated bottom surface and sidewalls of a respective one of the contact plugs 344. In some embodiments, each of the seed layers is a metal layer, which may be a single layer or a composite layer comprising a plurality of sub-layers formed of different materials. The seed layers are formed using, for example, PVD or the like. In one embodiment, the seed layers may be omitted. As shown in FIG. 13A, no contact plug 344 is disposed in the first region PR1, for example. In other words, the contact plugs 344 are only disposed in the second region PR2.

Barrier layer or adhesive layers 342 may be optionally formed before forming the contact plugs 344. In some embodiments, the barrier layer or adhesive layers 342 may be optionally formed between the contact plugs 344 and the ILD layer 340, between the contact plugs 344 and the ILD layer 330, and between the contact plugs 344 and the dielectric layer 328. Owing to the additional barrier layer or adhesive layers 342, it is able to ensure the adhesion between the contact plugs 344 and the ILD layer 340, between the contact plugs 344 and the ILD layer 330, and between the contact plugs 344 and the dielectric layer 328. As shown in FIG. 13A and FIG. 13B, the barrier layer or adhesive layers 342 line on the sidewalls of the contact plugs 344, where the contact plugs 344 respectively stand on the source/drain regions 326, for example. The additional barrier layer or adhesive layers 342 may include Ti, TiN, Ta, TaN, a combination thereof, a multilayer thereof, or the like, and may be formed using CVD, ALD, PVD, a combination thereof, or the like. In an alternative embodiment of which the seed layer is included, the additional barrier layer or adhesive layer 342 is interposed between the seed layer and the ILD layer 340, between the seed layer and the ILD layer 330 and between the seed layer and the dielectric layer 328, where the seed layer is interposed between the contact plugs 344 and the additional barrier layer or adhesive layer 342. In the embodiments of the seed layer is presented, owing to the additional barrier layer or adhesive layer 342, it is able to prevent the seed layer and/or the contact plugs 344 from diffusing to the underlying layers and/or the surrounding layers. In one embodiment, the additional barrier layer or adhesive layer 342 may be omitted.

Figure 14A:
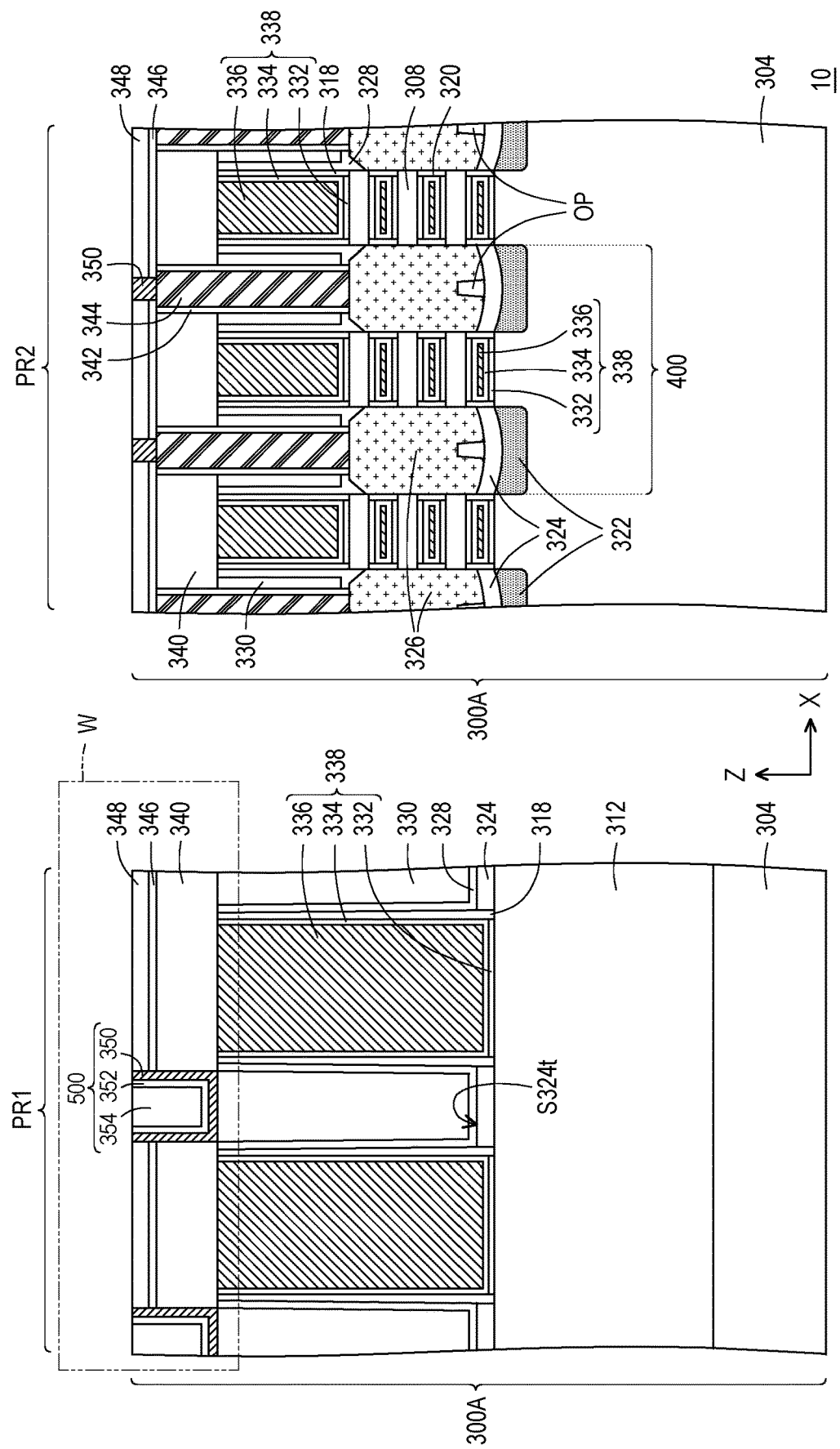
Figure 14B:
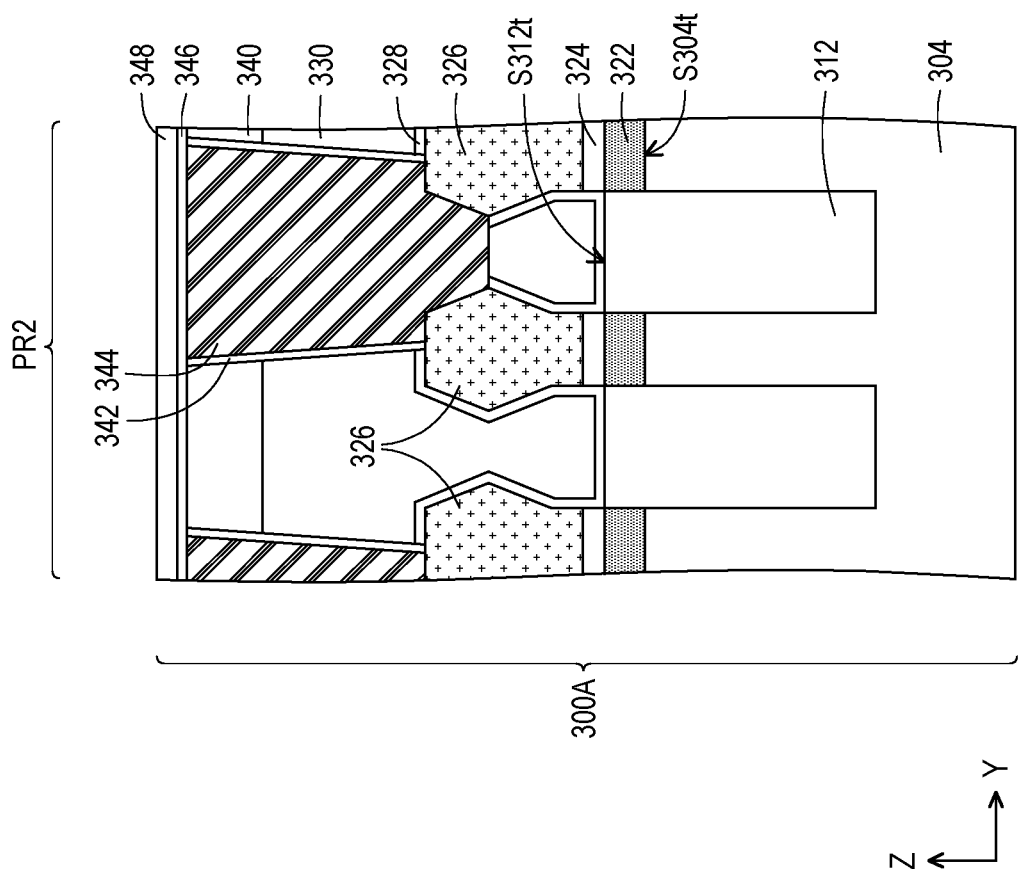
Figure 15A:
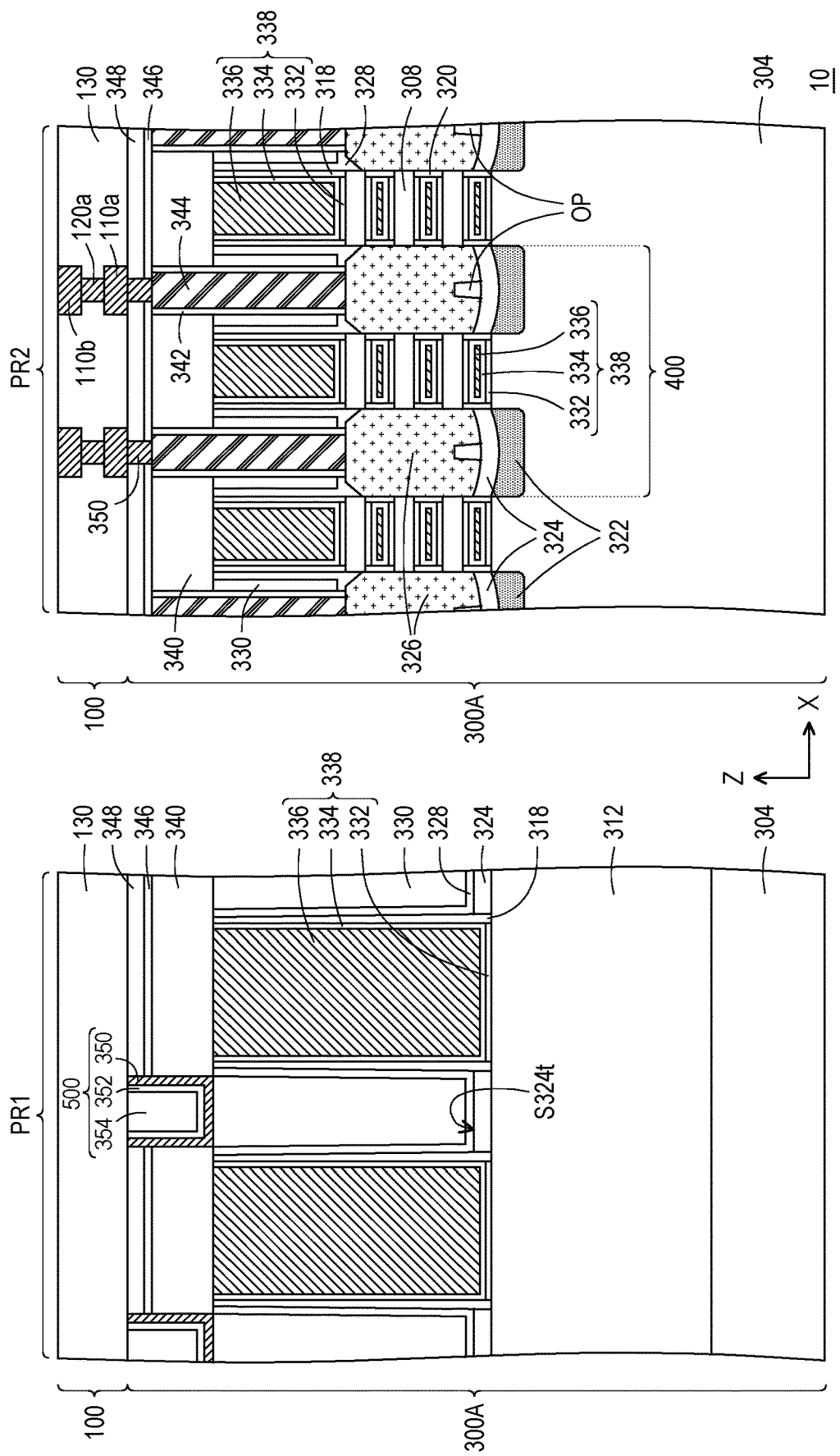

Referring to FIG. 14A and FIG. 14B, in some embodiments, a dielectric layer 346 is formed on the structure depicted in FIG. 13A and FIG. 13B (within both of the first region PR1 and the second region PR2), a dielectric layer 348 is then formed atop the dielectric layer 346, and a conductive material 350 is formed in a plurality of third openings (not labeled) penetrating the dielectric layer 348, the dielectric layer 346 and the ILD layer 340 within the first region PR1 and in a plurality of fourth openings (not labeled) penetrating the dielectric layer 348 and the dielectric layer 346 within the second region PR2. The conductive material 350 disposed in the plurality of third openings within the first region PR1 may be referred to as conductive patterns 350, while the conductive material 350 disposed in the plurality of fourth openings within the second region PR2 may be referred to as conductive vias 350. The conductive patterns 350 and the conductive vias 350 are physically spacing away from each other, in some embodiments.

Figure 14C:
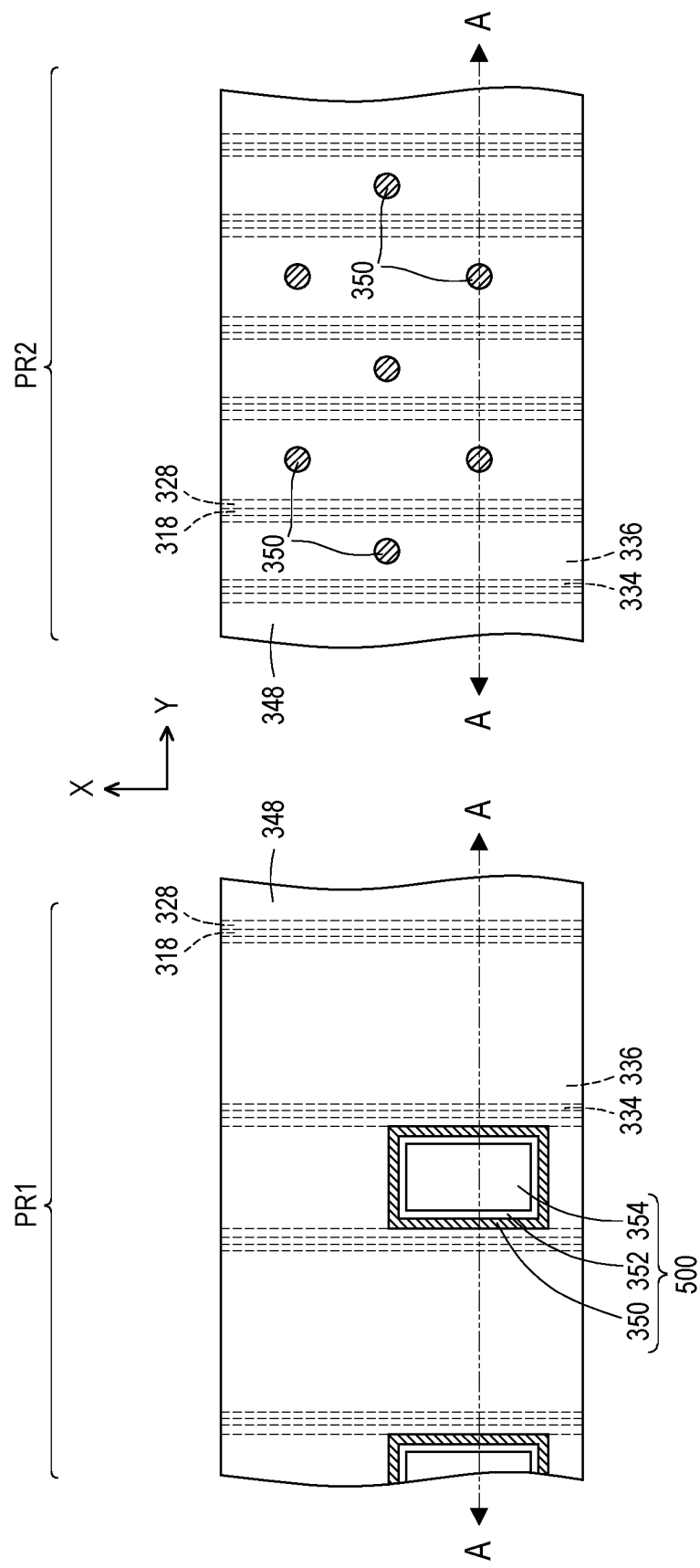
FIG. 14C is a schematic horizontal cross-sectional view of the semiconductor device depicted in FIG. 14A.

For the first region PR1, in some embodiments, the conductive patterns 350 line sidewalls and bottoms of the fourth openings, as shown in FIG. 14A. In other words, the conductive patterns 350 are laterally covered by the ILD layer 340, the dielectric layer 346 and the dielectric layer 348, where illustrated top surfaces (not labeled) of the conductive patterns 350 are accessibly revealed by the dielectric layer 348. The illustrated top surfaces of the conductive patterns 350 may be substantially leveled with an illustrated top surface of the dielectric layer 348, as shown in FIG. 14A. In the case, the illustrated top surface of the conductive patterns 350 are substantially coplanar to the illustrated top surface of the dielectric layer 348. In some embodiments, the conductive patterns 350 are not overlapped with the transistors 400 and the contact plugs 344 disposed in the second region PR2 and the gate structures 338 disposed in the first region PR1. The conductive patterns 350 may be electrically isolated to the transistors 400 and the contact plugs 344 disposed in the second region PR2 and the gate structures 338 disposed in the first region PR1. The conductive patterns 350 may be offset from the gate structures 338 along the direction X, as shown in FIG. 14A. Alternatively, the conductive patterns 350 may be offset from the gate structures 338 along the direction Y. In other words, in a vertical projection on the semiconductor substrate 304 along the direction Z, positioning locations of the conductive patterns 350 are not overlapped with positioning locations of the gate structures 338, as shown in FIG. 14A and FIG. 14C. The conductive patterns 350 are physically spacing away from each other, for example.

For the second region PR2, in some embodiments, the conductive vias 350 are laterally covered by the dielectric layer 346 and the dielectric layer 348, where illustrated top surfaces (not labeled) of the conductive vias 350 are accessibly revealed by the dielectric layer 348 for electrical connection with later-formed elements, such as conductive features in a later-formed interconnect or interconnection structure. The conductive vias 350 may be referred to as contact vias, metallization vias, metal vias, or metallic vias. The illustrated top surfaces of the conductive vias 350 may be substantially leveled with the illustrated top surface of the dielectric layer 348, as shown in FIG. 14A. In the case, the illustrated top surface of the conductive vias 350 are substantially coplanar to the illustrated top surface of the dielectric layer 348. In some embodiments, the conductive vias 350 are electrically coupled to the transistors 400 underlying thereto through the contact plugs 344 connecting the source/drain regions 326. In other words, the conductive vias 350 directly stand atop of the contact plugs 344, where the conductive vias 350 are in physical contact with the contact plugs 344. As illustrated in FIG. 14A, the conductive vias 350 may be overlapped with the contact plugs 344, in the direction Z. In some embodiments, the conductive vias 350 are electrically connected to the contact plugs 344, respectively. The conductive vias 350 are physically spacing away from each other, for example. For example, some of the conductive vias 350 are electrically connected to the contact plugs 344 connected to the source/drain regions 326, and some of the conductive vias 350 are electrically connected to the gate electrodes 336 of the gate structure 338. The conductive vias 350 electrically connected to the contact plugs 344 connected to the source/drain regions 326 may be referred to as source/drain contacts (e.g., the conductive vias 350 disposed between two adjacent gate electrodes 336 depicted in FIG. 14C), and the conductive vias 350 electrically connected to the gate electrodes 336 of the gate structure 338 may be referred to as gate contacts (e.g., the conductive vias 350 overlapped with the gate electrodes 336 depicted in FIG. 14C).

The dielectric layer 346 may be referred to as a protection layer, an etch stop layer or a contact etch stop (CES) layer. A thickness T346 of the dielectric layer 346 may be in a range of about 10 nm to about 100 nm. Although other value of the thickness T346 of the dielectric layer 346 is possible depending on product and process requirements. In some embodiments, a material of the dielectric layer 346 includes SiC, LaO, AlO, AlON, ZrO, HfO, SiN, ZnO, ZrN, ZrAlO, TiO, TaO, YO, TaCN, ZrSi, SiOCN, SiOC, SiCN, LaO, or SiO. The dielectric layer 346 may be formed by suitable fabrication techniques such as spin-on coating, CVD, PECVD, or the like. The dielectric layer 348 may be referred to as an ILD layer. A thickness T348 of the dielectric layer 348 measured along the direction Z may be in a range of about 10 nm to about 100 nm. Although other value of the thickness T348 of the dielectric layer 348 is possible depending on product and process requirements. In some embodiments, a material of the dielectric layer 348 includes SiC, LaO, AlO, AlON, ZrO, HfO, SiN, ZnO, ZrN, ZrAlO, TiO, TaO, YO, TaCN, ZrSi, SiOCN, SiOC, SiCN, LaO, or SiO. The dielectric layer 348 may be formed by suitable fabrication techniques such as spin-on coating, CVD, PECVD, or the like. In some embodiments, the material of the dielectric layer 346 is different from the material of the dielectric layer 348.

A thickness T350 (e.g., a shortest distance between two opposite sides) of the conductive patterns 350 in the first region PR1 and a thickness (not shown, measured along the direction Z) of the conductive vias 350 in the second region PR2 may be in a range of about 3 nm to about 30 nm. Although other value of the thicknesses of the conductive patterns 350 in the first region PR1 and the conductive vias 350 in the second region PR2 are possible depending on product and process requirements. In some embodiments, a material of the conductive patterns 350 in the first region PR1 and the conductive vias 350 in the second region PR2 includes Co, W, Ru, Al, Mo, Ti, or Cu. The conductive patterns 350 in the first region PR1 and the conductive vias 350 in the second region PR2 may be formed by, for example, plating such as electroplating or electroless plating; CVD such as PECVD; ALD; PVD; a combination thereof; or the like. In addition, seed layers (not shown) may be optionally formed before forming the conductive patterns 350 in the first region PR1 and the conductive vias 350 in the second region PR2 to line the illustrated bottom surfaces and sidewalls of the third openings for wrapping the bottoms and outer sidewalls of the conductive patterns 350 in the first region PR1 and the fourth openings for wrapping the bottoms and sidewalls of the conductive vias 350 in the second region PR2. In some embodiments, each of the seed layers is a metal layer, which may be a single layer or a composite layer comprising a plurality of sub-layers formed of different materials. The seed layers are formed using, for example, PVD or the like. In one embodiment, the seed layers may be omitted.

Figure 14D:
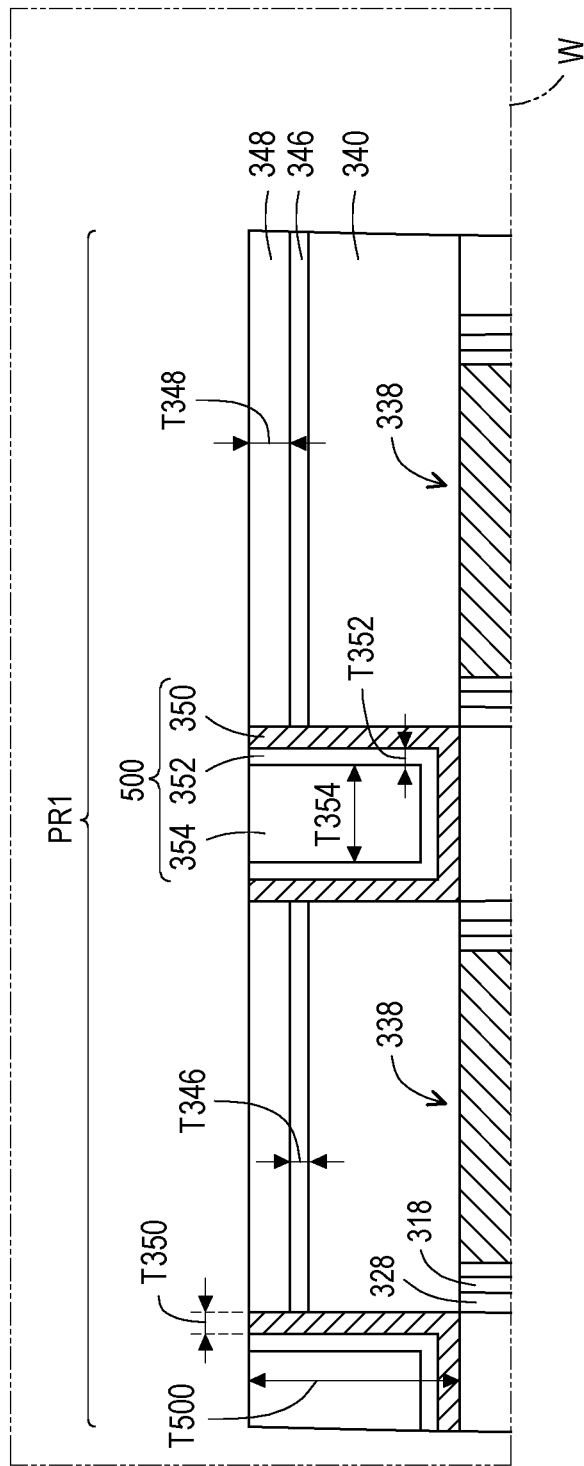
FIG. 14D is a schematic, enlarged first vertical cross-sectional view of a portion of the semiconductor device outlined in a dashed box W as shown in FIG. 14A.

Continued on FIG. 14A and FIG. 14B, after the formation of the conductive patterns 350 in the first region PR1 and the conductive vias 350 in the second region PR2, a plurality of dielectric patterns 352 are conformally formed on the conductive patterns 350, and a plurality of dielectric patterns 354 are formed on the dielectric patterns 352 to fill the third openings, for example. In the case, one of the conductive patterns 350 is sandwiched between the ILD layer 340 and a respective one of the dielectric layers 352, between the dielectric layer 346 and the respective one of the dielectric layers 352 and between the dielectric layer 348 and the respective one of the dielectric layers 352, while the respective one of the dielectric layers 352 is sandwiched between this conductive pattern 350 and a respective one of the dielectric patterns 354. Illustrated top surfaces (not labeled) of the dielectric patterns 352 may be substantially leveled with the illustrated top surface of the dielectric layer 348, as shown in FIG. 14A and FIG. 14D. In the case, the illustrated top surface of the dielectric patterns 352 are substantially coplanar to the illustrated top surface of the dielectric layer 348. Illustrated top surfaces (not labeled) of the dielectric patterns 354 may be substantially leveled with the illustrated top surface of the dielectric layer 348, as shown in FIG. 14A and FIG. 14D. In the case, the illustrated top surface of the dielectric patterns 354 are substantially coplanar to the illustrated top surface of the dielectric layer 348. Up to here, a plurality of alignment marks 500 (each including one conductive pattern 350, one dielectric pattern 352, and one dielectric pattern 354) are manufactured in the first region PR1, only. A thickness T500 (measured along the direction Z) of the alignment marks 500 may be in a range of about 10 nm to about 100 nm. Although other value of the thickness T500 of the alignment marks 500 is possible depending on product and process requirements.

The dielectric patterns 352 may be referred to as dielectric liners. Owing to the dielectric patterns 352, the conductive patterns 350 may be prevented from being oxidized by the dielectric patterns 354. A thickness T352 of the dielectric patterns 352 may be in a range of about 1.5 nm to about 15 nm. Although other value of the thickness T352 of the dielectric patterns 352 is possible depending on product and process requirements. In some embodiments, a material of the dielectric patterns 352 includes SiN or SiCN. The dielectric patterns 352 may be formed by suitable fabrication techniques such as spin-on coating, CVD, PECVD, or the like. However, the disclosure is not limited thereto; alternatively, the dielectric patterns 352 may be optional and can be omitted. In such alternative embodiment, the thickness T352 of the dielectric patterns 352 is zero.

The dielectric patterns 354 may be referred to as overburden dielectrics. A size T354 of the dielectric patterns 354 measured along the direction X may be greater than 20 nm, for example, about 20 nm to about 200 nm. Although other value of the size T354 of the dielectric patterns 354 is possible depending on product and process requirements. On the other hand, a size of the dielectric patterns 354 measured along the direction Y (not shown) may be greater than 20 nm, for example, about 20 nm to about 200 nm. Although other value of the size T354 of the dielectric patterns 354 measured along the direction Y is possible depending on product and process requirements. In some embodiments, a material of the dielectric patterns 354 includes SiC, LaO, AlO, AlON, ZrO, HfO, SiN, ZnO, ZrN, ZrAlO, TiO, TaO, YO, TaCN, ZrSi, SiOCN, SiOC, SiCN, LaO, or SiO. The dielectric patterns 354 may be formed by suitable fabrication techniques such as spin-on coating, CVD, PECVD, or the like. In some embodiments, the material of the dielectric patterns 354 is different from the material of the dielectric patterns 352.

Barrier layer or adhesive layers (not shown) may be optionally formed in the third openings and the fourth openings before forming the conductive patterns 350 and the seed layer (if any) in the first region PR1 and the conductive vias 350 and the seed layer (if any) in the second region PR2. In some embodiments, one of the barrier layer or adhesive layers is optionally formed between the ILD layer 340 and a respective one of the conductive patterns 350, between the dielectric layer 346 and the respective one of the conductive patterns 350 and between the dielectric layer 348 and the respective one of the conductive patterns 350 within the first region PR1, and one of the barrier layer or adhesive layers is optionally formed between the dielectric layer 346 and a respective one of the conductive vias 350 and between the dielectric layer 348 and the respective one of the conductive vias 350 within the second region PR2.

Owing to the additional barrier layer or adhesive layers, it is able to ensure the adhesion between the conductive patterns 350 and the ILD layer 340, between the conductive patterns 350 and the dielectric layer 346, and between the conductive patterns 350 and the dielectric layer 348 (within the first region PR1) and the adhesion between the conductive vias 350 and the dielectric layer 346 and between the conductive vias 350 and the dielectric layer 348 (within the second region PR2). That is, owing to the additional barrier layer or adhesive layer, it is may prevent the delamination between the conductive patterns 350 and other layers surrounding thereto and between the conductive vias 350 and other layers surrounding thereto. The barrier layer or adhesive layers line on the sidewalls and bottoms of the third openings and the sidewalls and bottoms of the fourth openings. The additional barrier layer or adhesive layers may include Ti, TiN, Ta, TaN, a combination thereof, a multilayer thereof, or the like, and may be formed using CVD, ALD, PVD, a combination thereof, or the like. In some embodiment, the additional barrier layer or adhesive layers are made of TiN or TaN. For the first region PR1, in an alternative embodiment of which the seed layer is included, the additional barrier layer or adhesive layer is interposed between the seed layer and the ILD layer 340, between the seed layer and the dielectric layer 348 and between the seed layer and the dielectric layer 346, where the seed layer is interposed between the conductive patterns 350 and the additional barrier layer or adhesive layer. For the second region PR2, in an alternative embodiment of which the seed layer is included, the additional barrier layer or adhesive layer is interposed between the seed layer and the dielectric layer 348 and between the seed layer and the dielectric layer 346, where the seed layer is interposed between the conductive vias 350 and the additional barrier layer or adhesive layer. In the embodiments of the seed layer is presented, owing to the additional barrier layer or adhesive layer, it is may prevent the delamination between the seed layers and other layers surrounding thereto. A thickness (not shown, e.g., a shortest distance between two opposite sides) of the additional barrier layer or adhesive layer may be in a range of about 1.1 nm to about 5 nm. Although other value of the size T354 of the dielectric patterns 354 is possible depending on product and process requirements. However, the disclosure is not limited thereto; alternatively, the additional barrier layer or adhesive layers can be omitted. In such alternative embodiment, the thickness of the additional barrier layer or adhesive layers is zero.

The formation of the dielectric layer 346, the dielectric layer 348, the conductive vias 350, and the alignment marks 500 (including the conductive patterns 350, the dielectric patterns 352, and the dielectric patterns 354) may include, but not limited to, conformally forming a material layer of the dielectric layer 346 over the structure depicted in FIG. 14A and FIG. 14B; conformally forming a material layer of the dielectric layer 348 over the material layer of the dielectric layer 346; performing a first patterning process to the material layer of the dielectric layer 348, the material layer of the dielectric layer 346, and the ILD layer 340 to form the third openings in the first region PR1, which penetrate through the dielectric layer 348, the dielectric layer 346 and the ILD layer 340 to expose portions of the ILD layers 330; performing a second patterning process to the material layer of the dielectric layer 348 and the material layer of the dielectric layer 346 to form the fourth openings in the second region PR2, which penetrate through the dielectric layer 348 and the dielectric layer 346 and the ILD layer 340 to expose portions of the contact plugs 344; conformally forming a material layer of the conductive material over the dielectric layer 348, which further extend into the third openings to line the sidewalls and bottoms of the third openings and further extend into the fourth openings to fill the fourth openings; conformally forming a material layer of the dielectric patterns 352 over the material layer of the conductive material, which is further extended into the third openings and extend over the further openings; conformally forming a material layer of the dielectric patterns 354 over the material layer of the dielectric patterns 352, which is further extended into the third openings and extend over the further openings; and performing a planarization process to remove excess materials of the dielectric patterns 354, the dielectric patterns 352, and the conductive material from the illustrated top surface of the dielectric layer 348 to form the alignment marks 500 (including the conductive patterns 350, the dielectric patterns 352, and the dielectric patterns 354) in the first region PR1 and to form the conductive vias 350 in the second region PR2. The planarization process may include a grinding process, a CMP process, an etching process, or combinations thereto. The etching process may include a dry etching, a wet etching, or a combination thereof. In some embodiments, the planarization process may also remove a portion of the dielectric layer 348. After the planarization process, the illustrated top surface of the dielectric layer 348 may be substantially leveled with (e.g., coplanar to) illustrated top surfaces of the alignment marks 500 and the illustrated top surfaces of the conductive vias 350, within process variations. In the disclosure, the transistors 400, the contact plugs 344, the conductive vias 350, and the alignment marks 500 are formed in front-end-of-line (FEOL) process.

As shown in FIG. 14A, for example, the third openings are lined with the conductive patterns 350 and the dielectric patterns 352, and then filled by the dielectric patterns 354. Owing to the dielectric patterns 354 (e.g., a thick dielectric layer), the conductive patterns 350 may be considered as a thin metallization layer, and the amount of the conductive patterns 350 disposed inside the third openings can be greatly reduced, so that the delamination (e.g., metal peeling) between the conductive patterns 350 and the surrounding dielectrics (such as the ILD layer 340, the dielectric layer 346, and the dielectric layer 348) can be eliminated. With such configuration (e.g., the thin metallization layer), the cohesion force at the conductive patterns 350 of the alignment marks 500 can be lower, thereby opening to more options for a material selection of the conductive material forming the conductive patterns 350 and the conductive vias 350. Therefore, the conductive vias 350 of a low resistivity (low-R) can be achieved. Besides, during the planarization process (such as a CMP process), owing to the dielectric patterns 354, areas of the conductive patterns 350 disposed in the third openings is greatly reduced, so to facilitate the co-planarity of the alignment marks 500, the conductive vias 350 and the dielectric layer 348 during the CMP process, without over-removing (e.g., over-dishing) the material of the alignment marks 500, the conductive vias 350 and the dielectric layer 348. With such configuration, the dielectric patterns 354 is beneficial for the planarization process (such as a CMP process), thereby opening to more options for a material selection of the CMP slurry. In the disclosure, the planarization process for forming the alignment marks 500 and the conductive vias 350 can be promoted due to the eliminations to several process issues (such as metal pealing, planarizing loading, etc.) are achieved, and thus it is opening to more options for a material selection of the conductive material forming the conductive patterns 350 for low resistivity (low-R) and for a material selection of the CMP slurry.

The first patterning process and the second patterning process may be simultaneously performed. Alternatively, the first patterning process may be performed prior to the second patterning process, or vice versa. In some embodiments, the conductive vias 350 serving as the source/drain contacts and the conductive vias 350 serving as the gate contacts may be formed in the same steps, simultaneously. However, the disclosure is not limited thereto, alternatively, the conductive vias 350 serving as the source/drain contacts and the conductive vias 350 serving as the gate contacts may be formed in different steps. For example, the conductive vias 350 serving as the source/drain contacts may be formed prior to the formation of the conductive vias 350 serving as the gate contacts, or vice versa. In such alternative embodiments, the material of the conductive vias 350 serving as the source/drain contacts can be different from the material of the conductive vias 350 serving as the gate contacts. For one non-limiting example, the material of the conductive vias 350 serving as the source/drain contacts are not wrapped by the additional barrier layer or adhesive layers, while the material of the conductive vias 350 serving as the gate contacts are wrapped by the additional barrier layer or adhesive layers. For another non-limiting example, the material of the conductive vias 350 serving as the source/drain contacts are wrapped by the additional barrier layer or adhesive layers, while the material of the conductive vias 350 serving as the gate contacts are not wrapped by the additional barrier layer or adhesive layers. Up to here, a device structure 300A of the semiconductor device is manufactured, where the device structure 300A includes the alignment marks 500 in the first region PR1 and the transistors 400 in the second region PR2, and the alignment marks 500 are offset from the transistors 400 and the contact plugs 344 disposed in the second region PR2 and the gate structures 338 disposed in the first region PR1 along the direction Z. The alignment marks 500 may be electrically isolated to the transistors 400 and the contact plugs 344 disposed in the second region PR2 and the gate structures 338 disposed in the first region PR1.

Figure 15B:
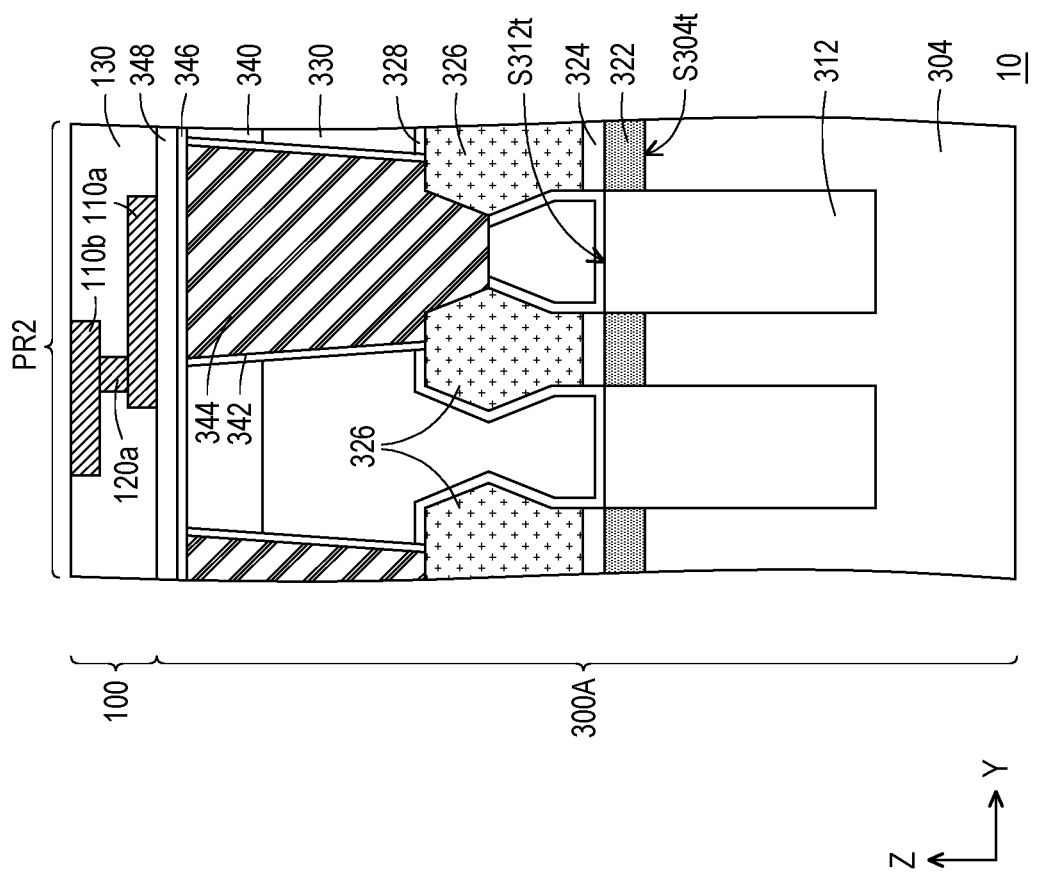

Referring to FIG. 15A and FIG. 15B, an interconnection structure 100 may be formed over the device structure 300A, within both of the first region PR1 and the second region PR2. For example, the interconnection structure 100 may include a stack 130 of dielectric layers and interconnections (110a, 120a, and 110b) formed in the stack 130 of dielectric layers. For example, as shown in FIG. 15A and FIG. 15B, the stack 130 of the dielectric layers are disposed in the first region PR1 and the second region PR2, while the interconnections (110a, 120a, and 110b) are disposed in the second region PR2. The interconnections (110a, 120a, and 110b) are electrically connected to the transistors 400 through the conductive vias 350 and the contact plugs 344, for example. As shown in FIG. and FIG. 15B, the interconnections includes conductive layers 110a, 110b and conductive vias 120a alternately stacked upon one another (along the direction Z), in some embodiments. The conductive layers 110a, 110b are connected and electrically coupled to each other through the conductive vias 120a, and the conductive layer 110a is connected and electrically coupled to the conductive vias 350, so to provide routing function to the transistors 400. The formation and material of each of the conductive layers 110a, 110b and the conductive vias 120a are similar to or substantially identical to the formation and material of the conductive vias 350, the formation and material of the dielectric layers included in the stack 130 are similar to or substantially identical to the formation and material of the dielectric layer 348, and thus are not repeated herein for brevity. In the disclosure, the interconnection structure 100 is formed in back-end-of-line (BEOL) process.

The interconnection structure 100 may be referred to as a front-side interconnect, a front-side interconnection, or a front-side interconnection structure to provide routing functions to the transistors 400 and/or other devices formed underneath thereto. Up to here, the semiconductor device 10 is manufactured, where the semiconductor device 10 includes the device structure 300A and the interconnection structure 100 disposed on the front side of the device structure 300A, and the conductive layers 110a, 110b and the conductive vias 120a included in the interconnection structure 100 are not overlapped with the alignment marks 500 disposed in the first region PR1 included in the device structure 300A, but overlapped with the transistors 400 disposed in the second region PR2 included in the device structure 300A. The conductive layers 110a, 110b and the conductive vias 120a included in the interconnection structure 100 may be electrically isolated from the alignment marks 500 included in the device structure 300A.

For illustrative purpose, only two build-up layers (e.g., a first build-up layer including the conductive layer 110a, conductive vias 120a and a portion of the stack 130a laterally covering the conductive layer 110a and conductive vias 120a, and a second build-up layer including the conductive layer 110b and a portion of the stack 130a laterally covering the conductive layer 110b) are shown in the interconnection structure 100, however the disclosure is not limited to the embodiments and/or drawings. The interconnection structure 100 may incudes one or more than one first build-up layer and one or more than one second build-up layer alternatively stacked along the direction Z.

Figure 16:
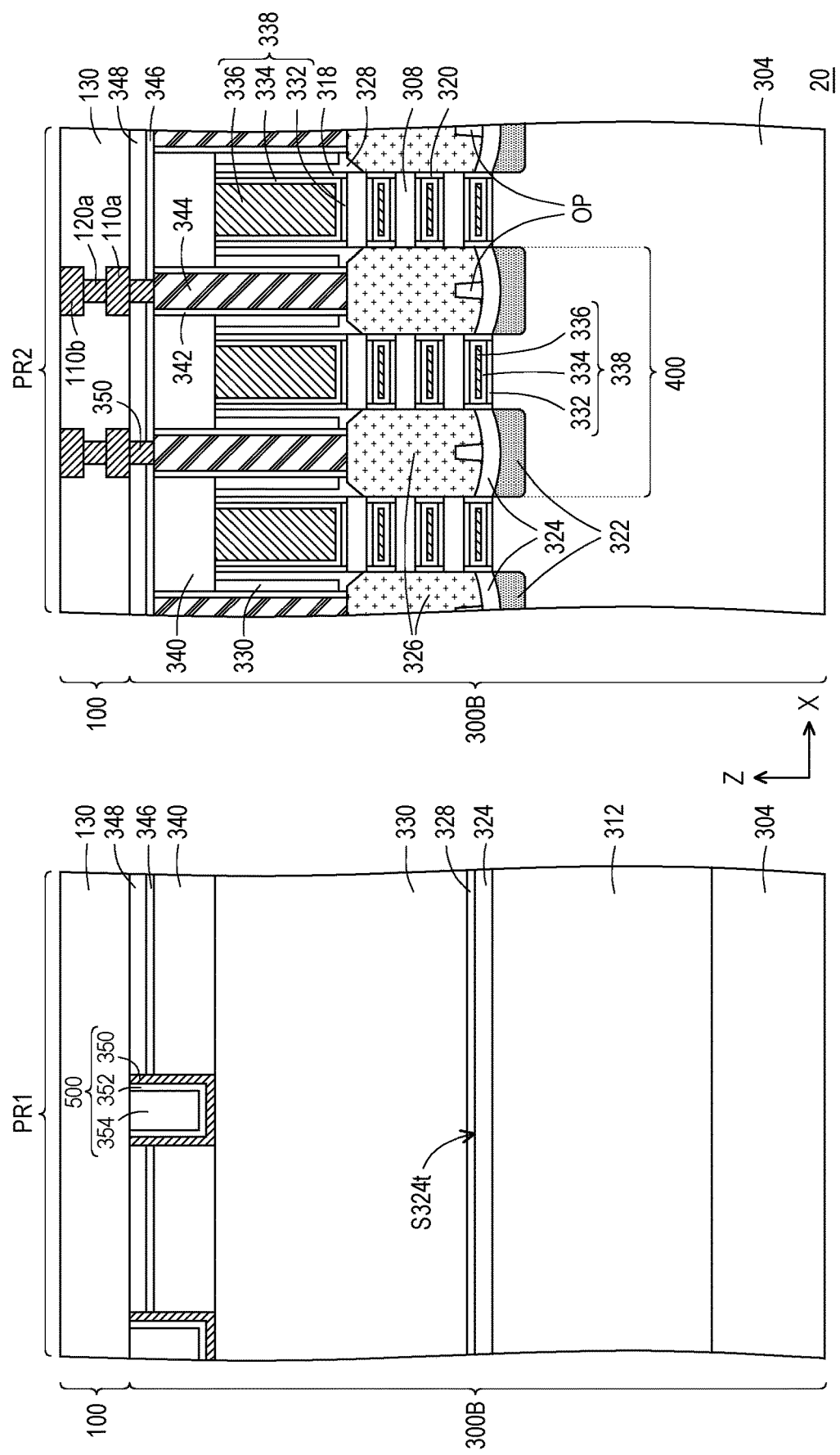
FIG. 16 is a schematic first vertical cross-sectional view of a semiconductor device in accordance with some alternative embodiments of the disclosure.
Figure 17:
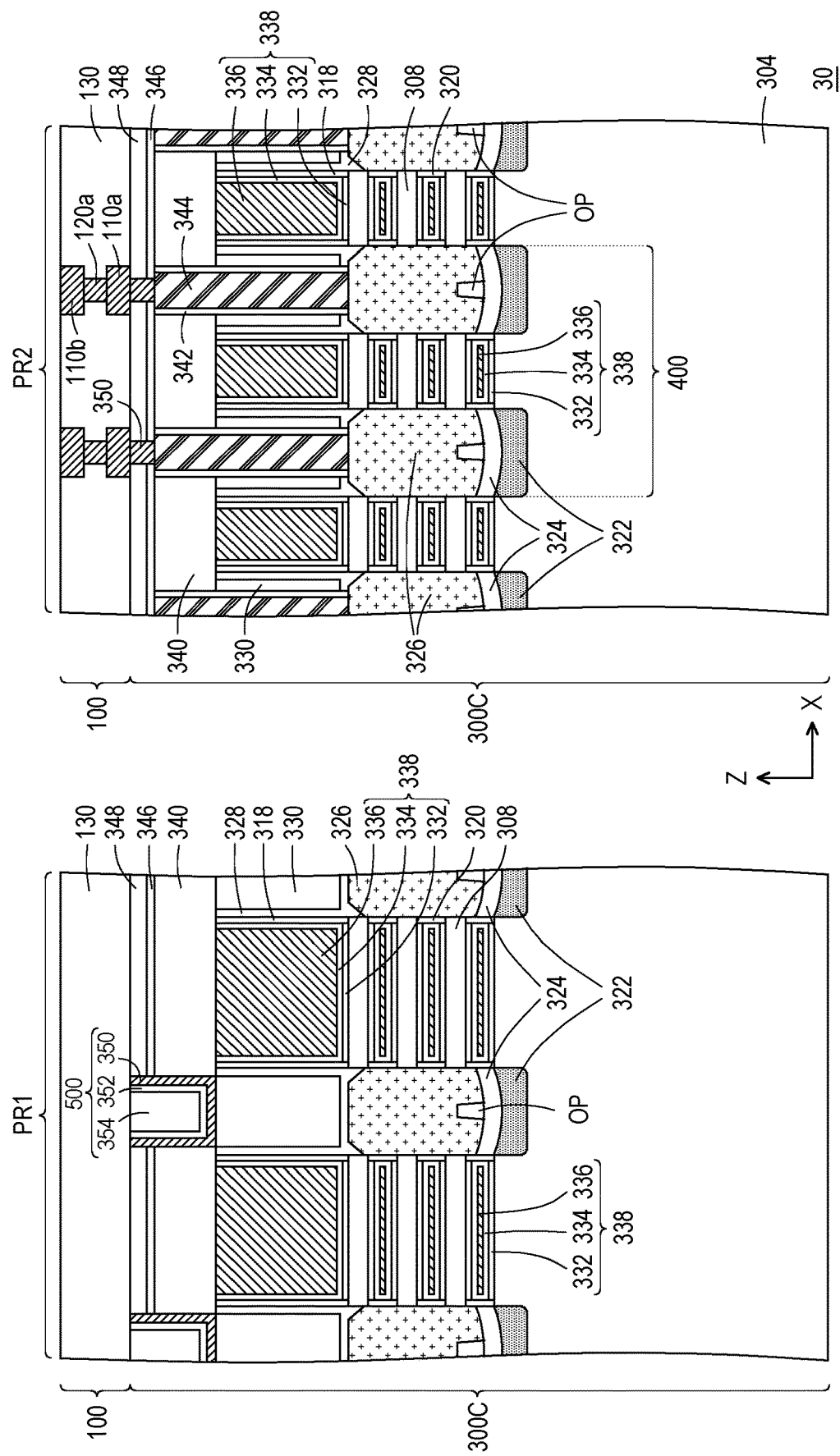
FIG. 17 is a schematic first vertical cross-sectional view of a semiconductor device in accordance with some alternative embodiments of the disclosure.

FIG. 16 is a schematic first vertical cross-sectional view of a semiconductor device 20 in accordance with some alternative embodiments of the disclosure. FIG. 17 is a schematic first vertical cross-sectional view of a semiconductor device 30 in accordance with some alternative embodiments of the disclosure. The elements similar to or substantially the same as the elements described previously will use the same reference numbers, and certain details or descriptions (e.g., the materials, formation processes, positioning configurations, electrical connections, etc.) of the same elements would not be repeated herein.

In some alternative embodiments, the gate structure 338 disposed in the first region PR1 may be omitted. Referring to FIG. 15A and FIG. 16 together, the semiconductor device depicted in FIG. 15A and the semiconductor device 20 depicted in FIG. 16 are similar; the difference is that, the semiconductor device 20 excludes the gate structures 338 disposed in the first region PR1. For example, as shown in FIG. 16, the semiconductor device 20 includes the device structure 300B and the interconnection structure 100 disposed on the front side of the device structure 300B, and the interconnection structure 100 is electrically coupled to the transistor 400 and other devices formed in the device structure 300B, where the alignment marks 500 (including the conductive patterns 350, the dielectric patterns 352, and the dielectric patterns 354) are disposed in the first region PR1 of the device structure 300B, and the transistors 400, the contact plugs 344 and the conductive vias 350 are disposed in the second region PR2 of the device structure 300B. In FIG. 16, within the first region PR1 along the direction Z, neither gate structure 338 nor the channels (e.g., the second semiconductor layers 308) are presented underneath the alignment marks 500, and neither the contact plugs 344, the conductive layers 110a, 100b nor the conductive vias 120a are presented above the alignment marks 500. The interconnection structure 100 may be electrically isolated from the alignment marks 500 included in the device structure 300B. The details of rest of the components included in the first region PR1 of the device structure 300B are similar to or substantially identical to the details of the components included in the first region PR1 of the device structure 300A previously discussed, the details of the components included in the second region PR2 of the device structure 300B are similar to or substantially identical to the details of the components included in the second region PR2 of the device structure 300A previously discussed, and thus are not repeated herein. For example, the formation of the device structure 300B is similar to the formation of the device structure 300A; except that, in the formation of the device structure 300B, the sacrificial gate structures and the capping structures 1004 (lying on the dummy gate electrodes 316 of the sacrificial gate structures) formed in the process described in FIG. 5A and FIG. 5B are not presented in the first region PR1.

In some alternative embodiments, a plurality of channel stacks (e.g., each channel stacks including multiple the second semiconductor layers 308 stacked on each other and separated from one another) may presented in the first region PR1. Referring to FIG. 15A and FIG. 17 together, the semiconductor device 10 depicted in FIG. 15A and the semiconductor device 30 depicted in FIG. 17 are similar; the difference is that, the semiconductor device 30 further includes the second semiconductor layers 308 (e.g., the channels) arranged into a plurality of stacks each having the second semiconductor layers 308 stacked on each other (along the direction Z) and engaged with the gate structures 338 disposed in the first region PR1. For example, as shown in FIG. 17, the semiconductor device 30 includes the device structure 300C and the interconnection structure 100 disposed on the front side of the device structure 300C, and the interconnection structure 100 is electrically coupled to the transistor 400 and other devices formed in the device structure 300C, where the alignment marks 500 (including the conductive patterns 350, the dielectric patterns 352, and the dielectric patterns 354) are disposed in the first region PR1 of the device structure 300C, and the transistors 400, the contact plugs 344 and the conductive vias 350 are disposed in the second region PR2 of the device structure 300C. In FIG. 17, within the first region PR1 along the direction Z, neither gate structure 338 nor the channels (e.g., the second semiconductor layers 308) are overlapped with the alignment marks 500, and neither the contact plugs 344, the conductive layers 110a, 100b nor the conductive vias 120a are presented above the alignment marks 500. The interconnection structure 100 may be electrically isolated from the alignment marks 500 included in the device structure 300C. The details of rest of the components included in the first region PR1 of the device structure 300C are similar to or substantially identical to the details of the components included in the first region PR1 of the device structure 300A previously discussed, the details of the components included in the second region PR2 of the device structure 300C are similar to or substantially identical to the details of the components included in the second region PR2 of the device structure 300A previously discussed, and thus are not repeated herein. For example, the formation of the device structure 300C is similar to the formation of the device structure 300A; except that, in the formation of the device structure 300C, the hard mask structures 1002 (lying on the stack of the first semiconductor layers 306 and the second semiconductor layers 308) formed in the process described in FIG. 2A and FIG. 2B are further presented in the first region PR1.

In accordance with some embodiments, a semiconductor device includes a semiconductor substrate, at least two source/drain features, at least two source/drain features, one or more channel layers, a gate structure, a first conductive feature, a second conductive feature, and an alignment mark. The semiconductor substrate has a first region and a second region next to the first region. The at least two source/drain features are disposed in the second region and are laterally arranged to each other. The one or more channel layers are disposed in the second region and connect the at least two source/drain features. The gate structure is disposed in the second region and engages the one or more channel layers and interposes the at least two source/drain features. The first conductive feature is disposed in the second region and is electrically coupled to the at least two source/drain features. The second conductive feature is disposed in the second region and is electrically coupled to the at least two source/drain features through the first conductive feature. The alignment mark is disposed in the first region and includes a first dielectric feature and a third conductive feature lining a bottom and a sidewall of the first dielectric features.

In accordance with some embodiments, a semiconductor device includes a device structure and an interconnection structure. The device structure has a device region and a peripherical region and next to the device region, where the device structure includes at least one transistor disposed in the device region, a plurality of first contacts disposed in the device region and over the at least one transistor, and a plurality of alignment marks disposed in the peripherical region and distant from the plurality of first contacts. The plurality of alignment marks each include a first dielectric feature and a first conductive feature lining a bottom and a sidewall of the first dielectric feature. The interconnection structure is disposed on the device structure and extending over the device region and the peripherical region, where the interconnection structure includes a second conductive feature electrically coupled to the at least one transistor through the plurality of first contacts. In a vertical projection on the device structure along a stacking direction of the device structure and the interconnection structure, the second conductive feature is offset from the plurality of alignment marks.

In accordance with some embodiments, a method of method of manufacturing a semiconductor device includes the following steps: providing a semiconductor substrate having a first region and a second region next to the first region; forming at least two source/drain features over the semiconductor substrate in the second region and laterally arranged to each other; forming one or more channel layers over the semiconductor substrate disposed in the second region and connecting the at least two source/drain features; disposing a gate structure over the semiconductor substrate in the second region and engaging the one or more channel layers and interposing the at least two source/drain features; forming a first conductive feature over the semiconductor substrate in the second region, the first conductive feature being electrically coupled to the at least two source/drain features; forming a second conductive feature over the semiconductor substrate in the second region, the second conductive feature being electrically coupled to the at least two source/drain features through the first conductive feature; and forming an alignment mark over the semiconductor substrate in the first region, the alignment mark comprising a first dielectric feature and a third conductive feature lining a bottom and a sidewall of the first dielectric feature.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
    a semiconductor substrate, having a first region and a second region next to the first region;
    at least two source/drain features, disposed in the second region and laterally arranged to each other;
    one or more channel layers, disposed in the second region and connecting the at least two source/drain features;
    a gate structure, disposed in the second region and engaging the one or more channel layers and interposing the at least two source/drain features;
    a first conductive feature, disposed in the second region and electrically coupled to the at least two source/drain features;
    a second conductive feature, disposed in the second region and electrically coupled to the at least two source/drain features through the first conductive feature; and
    an alignment mark, disposed in the first region and comprising:
        a first dielectric feature; and
        a third conductive feature, lining a bottom and a sidewall of the first dielectric feature,
    wherein a surface of the alignment mark is substantially coplanar to a surface of the second conductive feature.

2. The semiconductor device of claim 1, wherein a thickness of the alignment mark is from about 10 nm to about 100 nm.

3. The semiconductor device of claim 1, wherein a thickness of the alignment mark is greater than a thickness of the second conductive feature.

4. The semiconductor device of claim 1, wherein the one or more channel layers are further disposed in the first region, and the one or more channel layers are offset from the alignment mark in a vertical projection on the semiconductor substrate along a stacking direction of the first conductive feature and the second conductive feature.

5. The semiconductor device of claim 1, wherein the gate structure is further disposed in the first region, and the gate structure is offset from the alignment mark in a vertical projection on the semiconductor substrate along a stacking direction of the first conductive feature and the second conductive feature.

6. The semiconductor device of claim 5, wherein the one or more channel layers are further disposed in the first region and underlying the gate structure, and the one or more channel layers are offset from the alignment mark in the vertical projection on the semiconductor substrate along the stacking direction.

7. The semiconductor device of claim 1, wherein the alignment mark further comprises:
    a second dielectric feature, interposing the first dielectric feature and the third conductive feature, and lining a bottom and a sidewall of the first dielectric features.

8. The semiconductor device of claim 7, wherein a material of the first dielectric feature is different from the material of the second dielectric feature.

9. A semiconductor device, comprising:
    a device structure, having a device region and a peripherical region and next to the device region, wherein the device structure comprises at least one transistor disposed in the device region, a plurality of first contacts disposed in the device region and over the at least one transistor, and a plurality of alignment marks disposed in the peripherical region and distant from the plurality of first contacts, wherein the plurality of alignment marks each comprising a first dielectric feature and a first conductive feature lining a bottom and a sidewall of the first dielectric feature; and an interconnection structure, disposed on the device structure and extending over the device region and the peripherical region, wherein the interconnection structure comprises a second conductive feature electrically coupled to the at least one transistor through the plurality of first contacts, wherein in a vertical projection on the device structure along a stacking direction of the device structure and the interconnection structure, the second conductive feature is offset from the plurality of alignment marks.

10. The semiconductor device of claim 9, wherein the at least one transistor comprises a finFET transistor, a tunnel FTET, a GAA transistor, or a nanowire transistor.

11. The semiconductor device of claim 9, wherein the second conductive feature is only disposed over the device region.

12. The semiconductor device of claim 9, wherein the device structure further comprises:
a first dielectric layer, disposed in the device region and the peripherical region and over the at least one transistor;
a second dielectric layer, disposed in the device region and the peripherical region and over the first dielectric layer, wherein the first dielectric layer is sandwiched between the at least one transistor and the second dielectric layer; and
a third dielectric layer, disposed in the device region and the peripherical region and over the second dielectric layer, wherein the second dielectric layer is sandwiched between the first dielectric layer and the third dielectric layer,
wherein the plurality of first contacts penetrate through the second dielectric layer and the third dielectric layer to electrically coupled to the at least one transistor through a plurality of second contacts penetrating through the first dielectric layer,
wherein the plurality of alignment marks penetrate through the first dielectric layer, the second dielectric layer, and the third dielectric layer.

13. The semiconductor device of claim 12, wherein a material of the second dielectric layer is different from a material of the third dielectric layer.

14. The semiconductor device of claim 9, wherein the plurality of alignment marks each further comprises:
a second dielectric feature, interposing the first dielectric feature and the first conductive feature, and lining a bottom and a sidewall of the first dielectric features.

15. The semiconductor device of claim 14, wherein a material of the first dielectric feature is different from the material of the second dielectric feature.

16. A method of manufacturing a semiconductor device, comprising:
providing a semiconductor substrate having a first region and a second region next to the first region;
forming at least two source/drain features over the semiconductor substrate in the second region and laterally arranged to each other;
forming one or more channel layers over the semiconductor substrate disposed in the second region and connecting the at least two source/drain features;
disposing a gate structure over the semiconductor substrate in the second region and engaging the one or more channel layers and interposing the at least two source/drain features;

forming a first conductive feature over the semiconductor substrate in the second region, the first conductive feature being electrically coupled to the at least two source/drain features;
forming a second conductive feature over the semiconductor substrate in the second region, the second conductive feature being electrically coupled to the at least two source/drain features through the first conductive feature; and
forming an alignment mark over the semiconductor substrate in the first region, the alignment mark comprising a first dielectric feature and a third conductive feature lining a bottom and a sidewall of the first dielectric feature, wherein a surface of the alignment mark is substantially coplanar to a surface of the second conductive feature.

17. The method of claim 16, wherein forming the second conductive feature over the semiconductor substrate in the second region and forming the alignment mark over the semiconductor substrate in the first region are simultaneously performed by:
disposing a first dielectric layer over the gate structure, the first dielectric layer extending over the first region and the second region and laterally covering the first conductive feature;
disposing a second dielectric layer over the first dielectric layer, the second dielectric layer extending over the first region and the second region, the first dielectric layer being disposed between the gate structure and the second dielectric layer;
disposing a third dielectric layer over the second dielectric layer, the third dielectric layer extending over the first region and the second region, and the second dielectric layer being disposed between the first dielectric layer and the third dielectric layer;
forming a first opening in the first region and forming a second opening in the second region, the first opening penetrating through the first dielectric layer, the second dielectric layer and the third dielectric layer, the second opening penetrating the second dielectric layer and the third dielectric layer;
disposing a conductive material over the third dielectric layer, the conductive material further extending into the first opening and the second opening, wherein the second opening is filled with the conductive material;
disposing a first dielectric material over the conductive material, the first dielectric material further extending into the first opening and extending over the second opening;
disposing a second dielectric material over the first dielectric material, the second dielectric material further extending into the first opening and extending over the second opening, wherein the first opening is filled with the second dielectric material; and
performing a planarizing process to remove excess materials of the second dielectric material, the first dielectric material, and the conductive material from a topmost surface of the third dielectric layer to form the alignment mark in the first opening within the first region and the second conductive feature in the second opening within the second region.

18. The method of claim 16, wherein forming the second conductive feature over the semiconductor substrate in the second region and forming the alignment mark over the semiconductor substrate in the first region are simultaneously performed by:

disposing a first dielectric layer over the gate structure, the first dielectric layer extending over the first region and the second region and laterally covering the first conductive feature;

disposing a second dielectric layer over the first dielectric layer, the second dielectric layer extending over the first region and the second region, the first dielectric layer being disposed between the gate structure and the second dielectric layer;

disposing a third dielectric layer over the second dielectric layer, the third dielectric layer extending over the first region and the second region, and the second dielectric layer being disposed between the first dielectric layer and the third dielectric layer;

forming a first opening in the first region and forming a second opening in the second region, the first opening penetrating through the first dielectric layer, the second dielectric layer and the third dielectric layer, the second opening penetrating the second dielectric layer and the third dielectric layer;

disposing a conductive material over the third dielectric layer, the conductive material further extending into the first opening and the second opening, wherein the second opening is filled with the conductive material;

disposing a dielectric material over the conductive material, the dielectric material further extending into the first opening and extending over the second opening, wherein the first opening is filled with the dielectric material; and performing a planarizing process to remove excess materials of the dielectric material and the conductive material from a topmost surface of the third dielectric layer to form the alignment mark in the first region within the first region and the second conductive feature in the second opening within the second region.

19. The method of claim 16, further comprising:

forming an interconnection structure over the semiconductor device in the first region and the second region, wherein the interconnection structure comprises a fourth conductive feature electrically coupled to the at least one transistor through the first conductive feature and the second conductive feature, wherein the fourth conductive feature is offset from the alignment mark in a vertical projection on the semiconductor substrate along a stacking direction of the semiconductor substrate and the interconnection structure.

20. The semiconductor device of claim 1, wherein a material of the third conductive feature is the same as a material of the second conductive feature.

\* \* \* \* \*